United States Patent
Hasegawa et al.

(10) Patent No.: US 6,721,032 B2
(45) Date of Patent: Apr. 13, 2004

(54) EXPOSURE APPARATUS AND CONTROL METHOD THEREFOR, AND DEVICE MANUFACTURING METHOD

(75) Inventors: Noriyasu Hasegawa, Tochigi (JP); Shigeru Terashima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/207,248

(22) Filed: Jul. 30, 2002

(65) Prior Publication Data

US 2003/0025889 A1 Feb. 6, 2003

(30) Foreign Application Priority Data

| Jul. 30, 2001 | (JP) | 2001-229941 |
| Aug. 2, 2001 | (JP) | 2001-235183 |
| Jul. 25, 2002 | (JP) | 2002-216633 |

(51) Int. Cl.$^7$ .......................... G03B 27/52; G03B 27/42
(52) U.S. Cl. ........................... 355/30; 355/53
(58) Field of Search ............... 355/30, 52, 53, 355/55, 67–71; 250/492.2

(56) References Cited

U.S. PATENT DOCUMENTS

| 5,347,561 | A | * | 9/1994 | Ebinuma ..................... 378/34 |
| 5,430,303 | A | * | 7/1995 | Matsumoto et al. ...... 250/492.2 |
| 5,559,584 | A | | 9/1996 | Miyaji et al. .................. 355/73 |
| 5,883,701 | A | | 3/1999 | Hasegawa et al. ............ 355/53 |
| 5,898,477 | A | | 4/1999 | Yoshimura et al. ........... 355/53 |
| 5,914,773 | A | | 6/1999 | Kurosawa et al. ............ 355/53 |
| 6,054,713 | A | | 4/2000 | Miyake et al. .......... 250/492.24 |
| 6,204,911 | B1 | | 3/2001 | Kurosawa et al. ............ 355/53 |
| 6,377,338 | B1 | * | 4/2002 | Suenaga ...................... 355/67 |
| 6,424,405 | B2 | | 7/2002 | Kurosawa et al. ............ 355/53 |
| 2002/0000519 | A1 | | 1/2002 | Tsukamoto ............... 250/492.1 |
| 2002/0018190 | A1 | | 2/2002 | Nogawa et al. ............... 355/30 |
| 2002/0145711 | A1 | * | 10/2002 | Magome et al. .............. 355/30 |

FOREIGN PATENT DOCUMENTS

| JP | 10-214782 | 8/1998 |
| JP | 11-111586 | 4/1999 |
| JP | 2001-168027 | 6/2000 |
| JP | 2000-200745 | 7/2000 |
| JP | 2001-118783 | 4/2001 |
| JP | 2001-250759 | 9/2001 |
| JP | 2001-284224 | 10/2001 |

* cited by examiner

*Primary Examiner*—Henry Hung Nguyen
(74) *Attorney, Agent, or Firm*—Fitzpatrick, Cella, Harper & Scinto

(57) ABSTRACT

An exposure apparatus includes an illumination optical system which illuminates a pattern formed on a mask with light from a light source, a movable mask stage for holding the mask, a projection optical system which guides light from a pattern of the mask to a wafer, a movable wafer stage for holding the wafer, a shielding member which forms an optical path space including an optical path of exposure light and a space surrounding the optical path space at, of a space through which the exposure light passes, at least one portion between the illumination optical system and the mask stage, between the mask stage and the projection optical system, or between the protection optical system and the wafer stage, a first gas supply device for supplying an inert gas to the optical path space, a chamber surrounding the wafer stage, the projection optical system and the shielding member, and a reduction device for reducing a change in total light quantity of the exposure light reaching the wafer that is caused by movement of at least one of the mask stage and the wafer stage.

25 Claims, 17 Drawing Sheets

EXPOSURE APPARATUS AND CONTROL METHOD THEREFOR, AND DEVICE MANUFACTURING METHOD

FIELD OF THE INVENTION

The present invention relates to an exposure apparatus used for manufacturing, e.g., a semiconductor element, an image sensing element, a liquid crystal display element, a thin film magnetic head, and other microdevices.

BACKGROUND OF THE INVENTION

In a photolithography process for manufacturing a semiconductor element and the like, an exposure apparatus has been used which projects the pattern image of a mask (e.g., a reticle) onto a photosensitive substrate through a projection optical system and exposes it. In recent years, development of a micropatterned semiconductor integrated circuit has been progressing, and in the photolithography process, the wavelength of a photolithography light source is becoming short.

As the exposure light, when a vacuum ultraviolet ray, particularly, a light beam with a wavelength shorter than 250 nm, e.g., harmonics of a KrF excimer laser (with a wavelength of 248 nm), an ArF excimer laser (with a wavelength of 193 nm), an ($F_2$ laser (with a wavelength of 157 nm), or a YAG laser, or when X-rays are used, the intensity of the exposure light undesirably decreases because, e.g. the exposure light is absorbed by oxygen.

In view of this, conventionally, in an exposure apparatus having a light source such as an $F_2$ excimer laser, a hermetically sealed space that seals only the optical path portion is formed. The gas in the hermetically sealed space is substituted by a gas not containing oxygen, e.g., nitrogen, so a decrease in transmittance of the exposure light is prevented.

FIG. 15 is a view showing an exposure apparatus in which an inert gas is supplied to an optical path space between the final optical member of a projection optical system (lens barrel) and a photosensitive substrate (wafer) so as to form an inert gas atmosphere in the optical path space, and exposure is performed. In this exposure apparatus, a shielding member is formed around the optical path space in order to separate the optical path space above the exposure region and an atmosphere surrounding it, and the inert gas is supplied to this space from around the exposure region. Hence, the inert gas concentration of the atmosphere in the optical path space can be set high.

In the exposure apparatus shown in FIG. 15, a temperature control gas is supplied to around the exposure region in order to stabilize the temperature of the surrounding atmosphere. The pressure increases slightly at that end of the wafer stage to which the temperature control gas is blown directly. As the wafer stage moves, the pressure distribution around the optical path space changes. In this case, the pressure in the optical path space also changes in accordance with a pressure change accompanying the movement of the wafer stage, and the concentration of the inert gas in the optical path space changes undesirably in accordance with the change in pressure. Consequently, the inert gas concentration is not stable.

As shown in FIGS. 16 and 17, an atmosphere surrounding the optical path space may be entrained when the stage moves. When the surrounding atmosphere flows in the +X direction, as shown in FIG. 16, the stage moving in the +X direction entrains an atmosphere present below nozzle 1 (space A). To the contrary, the stage moving in the -X direction entrains an atmosphere present below nozzle 2 (space B). Due to the flow of the surrounding atmosphere, most of an inert gas leaked from the optical path space exists below nozzle 2 (space B). The inert gas concentration becomes different between spaces A and B, and is higher in space B. The concentration of the inert gas which enters the optical path space changes depending on the stage moving direction, thus changing the inert gas concentration in the optical path space.

The same problem occurs when the inert gas is supplied to around a mask (e.g., a reticle). With the reticle as well, the inert gas concentration in the optical path space surrounded by a shielding member also changes, and the inert gas concentration is not stable.

SUMMARY OF THE INVENTION

The present invention has been made in view of the above problem, and has as its object to provide an exposure apparatus in which an inert gas concentration in an optical path space including a space through which exposure light passes (exposure region), such as a space between a projection optical system and a substrate, a space between an illumination optical system for illuminating a mask (e.g., a reticle) and a mask stage for holding the mask, and a space between the mask stage and the projection optical system, can be stabilized at high precision, a control method for the same, and a device manufacturing method.

According to the present invention, the foregoing object is attained by providing an exposure apparatus comprising:

an illumination optical system which illuminates a pattern formed on a mask with light from a light source;

a movable mask stage for holding the mask;

a projection optical system which guides light from a pattern of the mask to a wafer;

a movable wafer stage for holding the wafer;

a shielding member which forms an optical path space including an optical path of exposure light and a space surrounding the optical path space at, of a space through which the exposure light passes, at least one portion between said illumination optical system and said mask stage, between said mask stage and said projection optical system, or between said projection optical system and said wafer stage;

first gas supply means for supplying an inert gas to the optical path space; and reduction means for reducing a change in total light quantity of the exposure light reaching the wafer that is caused by movement of said mask stage and/or said wafer stage.

In a preferred embodiment, said reduction means includes means for adjusting a light quantity which reaches the pattern of the mask.

In a preferred embodiment, said reduction means includes means for adjusting a light quantity of the light source.

In a preferred embodiment, said reduction means includes means for inserting a filter into the optical path of the exposure light from the light source.

In a preferred embodiment, said reduction means includes means for adjusting a stop arranged in the optical path of the exposure light from the light source.

In a preferred embodiment, said reduction means includes means for adjusting a driving speed of said mask stage and/or said wafer stage.

In a preferred embodiment, said reduction means is controlled based on at least one of positional information of said mask stage and/or said wafer stage, information about a moving speed, and information about a moving direction.

In a preferred embodiment, said apparatus further comprises a pressure sensor which measures a pressure in the optical path space, and said reduction means is controlled in accordance with an output from said sensor.

In a preferred embodiment, said apparatus further comprises a concentration sensor which measures an oxygen concentration and/or a wafer concentration in the optical path space.

said reduction means is controlled in accordance with an output from said sensor.

In a preferred embodiment, said apparatus further comprises a second gas supply means for supplying a gas to the surrounding space.

In a preferred embodiment, said gas supplied by said second gas supply means is an inert gas.

In a preferred embodiment, said apparatus further comprises:

said shielding member which shields from the surrounding space a first optical path space between said wafer stage and said projection optical system, wherein said first gas supply means supplies said inert gas toward a predetermined direction.

In a preferred embodiment, said apparatus further comprises:

said shielding member which shields from the surrounding space a first optical path space between said wafer stage and said projection optical system, said shielding member shielding from the surrounding space a second optical path space between said illumination optical system and said mask stage and/or between said mask stage and said projection optical system, and a supply port which supplies the inert gas to the first optical path space by said first gas supply means, and a supply port which supplies the inert gas to the second optical path space by said first gas supply means are formed at substantially opposite positions with respect to an optical axis of said illumination optical system and/or said projection optical system.

In a preferred embodiment, said reduction means adjusts an amount of the insert gas supplied to the optical path space and/or an amount of the gas exhausted from the optical space.

In a preferred embodiment, said reduction means adjusts an amount of the gas supplied to the surrounding space and/or an amount of the gas exhausted from the surrounding space.

In a preferred embodiment, said reduction means adjusts a light quantity of the exposure light with respect to a change in transmittance of the exposure light caused by movement of said mask stage and/or said wafer stage.

In a preferred embodiment, said apparatus includes a scanning exposure apparatus, and said reduction means changes a scanning speed with respect to a change in transmittance of the exposure light caused by movement of said mask stage and/or said wafer stage.

In a preferred embodiment, said reduction means reduces a change in inert gas concentration in the optical path space.

In a preferred embodiment, said reduction means reduces a change in pressure difference between the optical path space and the surrounding space.

In still another aspect of the present invention, the foregoing object is attained by providing a device manufacturing method comprising the steps of:

transferring, by using the exposure apparatus defined in claim 1, a pattern onto a substrate applied with a photosensitive material; and developing the substrate.

In still another aspect of the present invention, the foregoing object is attained by providing an exposure apparatus for projecting and transferring a pattern formed on a mask onto a substrate by using exposure light, comprising:

a stage;

an optical system;

a gas flow forming mechanism which forms a flow of an inert gas in an optical path space, between said stage and said optical system, including a space through which exposure light passes; and control means for controlling a flow velocity or pressure of an atmosphere around said gas flow forming mechanism.

In a preferred embodiment, the apparatus further comprises:

a supply unit arranged around said gas flow forming mechanism to supply a gas; and an exhaust unit arranged around said gas flow forming mechanism to exhaust the gas containing the inert gas.

In a preferred embodiment, said control means controls operation of at least one of said supply unit and said exhaust unit on the basis of a pressure in the optical path space.

In a preferred embodiment, said control means sets a supply amount of said supply unit to a constant value, and controls an exhaust amount of said exhaust unit on the basis of the pressure in the optical path space.

In a preferred embodiment, said control means sets an exhaust amount of said exhaust unit to a constant value, and controls a supply amount of said supply unit on the basis of a pressure in the optical path space.

In a preferred embodiment, said control means controls operation of at least one of said supply unit and said exhaust unit on the basis of a position of said stage.

In a preferred embodiment, said control means sets a supply amount of said supply unit to a constant value, and controls an exhaust amount of said exhaust unit on the basis of the position of said stage.

In a preferred embodiment, said control means sets an exhaust amount of said exhaust unit to a constant value, and controls a supply amount of said supply unit on the basis of the position of said stage.

In a preferred embodiment, said control means includes concentration measuring means for measuring a predetermined gas concentration in the optical path space, and controls operation of at least one of said supply unit and said exhaust unit on the basis of a measurement result of said concentration measuring means.

In a preferred embodiment, said control means sets a supply amount of said supply unit to a constant value, and controls an exhaust amount of said exhaust unit on the basis of the measurement result of said concentration measuring means.

In a preferred embodiment, said control means sets an exhaust amount of said exhaust unit to a constant value, and controls a supply amount of said supply unit on the basis of the measurement result of said concentration measuring means.

In a preferred embodiment, said control means includes concentration measuring means for measuring a predetermined gas concentration around the optical path space, and controls operation of at least one of said supply unit and said exhaust unit on the basis of a measurement result of said concentration measuring means.

In a preferred embodiment, said control means sets a supply amount of said supply unit to a constant value, and controls an exhaust amount of said exhaust unit on the basis of the measurement result of said concentration measuring means.

In a preferred embodiment, said control means sets an exhaust amount of said exhaust unit to a constant value, and controls a supply amount of said supply unit on the basis of the predetermined gas concentration around the optical path space.

In a preferred embodiment, said control means includes pressure measuring means for measuring a pressure around the optical path space, and controls operation of at least one of said supply unit and said exhaust unit on the basis of a measurement result of said pressure measuring means.

In a preferred embodiment, said control means sets a supply amount of said supply unit to a constant value, and controls an exhaust amount of said exhaust unit on the basis of the measurement result of said pressure measuring means.

In a preferred embodiment, said control means sets an exhaust amount of said exhaust unit to a constant value, and controls a supply amount of said supply unit on the basis of the measurement result of said pressure measuring means.

In a preferred embodiment, the predetermined gas is either one or a combination of the inert gas and a gas component, other than the inert gas, in an atmosphere.

In a preferred embodiment, said control means includes:
    a first flow controller which controls a supply amount of said supply unit, and
    a second flow controller which controls an exhaust amount of said exhaust unit.

In a preferred embodiment, said apparatus further comprises a chamber which hermetically seals an exposure apparatus main body including at least said stage, said optical system, and said gas flow forming mechanism, and
    said supply unit and said exhaust unit are formed in part of said chamber.

In a preferred embodiment, said supply unit includes a plurality of supply units respectively connected to flow controllers and serves to supply the gas in a vertical direction, and
    said control means controls operations of the plurality of supply units.

In a preferred embodiment, said control means controls operation of each of the plurality of supply units in accordance with a position of said stage.

In a preferred embodiment, said control means controls operation of each of the plurality of supply units in accordance with a predetermined gas concentration in the optical path space.

In a preferred embodiment, said control means controls operation of each of the plurality of supply units in accordance with a pressure in the optical path space.

In a preferred embodiment, the inert gas is nitrogen gas or helium gas.

In a preferred embodiment, said gas flow forming mechanism is arranged to form a flow of the inert gas in an optical path space between a projection optical system and a substrate.

In a preferred embodiment, said gas flow forming mechanism is arranged to form a flow of the inert gas in an optical path space between an illumination system for illuminating a mask and a mask stage for holding the mask.

In a preferred embodiment, said gas flow forming mechanism is arranged to form a flow of the inert gas in an optical path space between a mask stage for holding a mask and a projection optical system.

In a preferred embodiment, said gas flow forming mechanism includes:
    a first gas flow forming mechanism arranged to form a flow of the inert gas in a first optical path space between a projection optical system and a substrate,
    a second gas flow forming mechanism arranged to form a flow of the inert gas in a second optical path space between an illumination system for illuminating a mask and a mask stage for holding the mask, and
    a third gas flow forming mechanism arranged to form a flow of the inert gas in a third optical path space between the mask stage and the projection optical system.

In still another aspect of the present invention, the foregoing object is attained by providing a control method for an exposure apparatus including a stage, an optical system, and a gas flow forming mechanism which forms a flow of an inert gas in an optical path space, between said stage and said optical system, including a space through which exposure light passes, to project and transfer a pattern formed on a mask onto a substrate by using exposure light, comprising the steps of:
    measuring a pressure in the optical path space; and
    controlling a flow velocity or pressure of an atmosphere around the gas flow forming mechanism on the basis of the pressure measured in the measuring step.

In still another aspect of the present invention, the foregoing object is attained by providing a device manufacturing method comprising the steps of:
    transferring, by using an exposure apparatus, a pattern onto a substrate applied with a photosensitive material; and
    developing the substrate,
    the exposure apparatus including
        a stage,
        an optical system,
        a gas flow forming mechanism which forms a flow of an inert gas in an optical path space, between the stage and the optical system, including a space through which exposure light passes, and
        control means for controlling a flow velocity or pressure of an atmosphere around the gas flow forming mechanism.

In still another aspect of the present invention, the foregoing object is attained by providing an exposure apparatus for projecting and transferring a pattern formed on a mask onto a substrate by using exposure light, the apparatus comprising:
    a stage;
    an optical system;
    a gas flow forming mechanism which forms a flow of an inert gas in an optical path space, between said stage and said optical system, including a space through which exposure light passes;
    a first flow controller which controls a supply amount of the inert gas to be supplied to said gas flow forming mechanism;
    a second flow controller which controls an exhaust amount of a gas containing the inert gas to be exhausted from said gas flow forming mechanism; and
    control means for controlling operation of at least one of said first and second flow controllers.

In a preferred embodiment, said control means controls operation of at least one of said first and second flow controllers on the basis of a pressure in the optical path space.

In a preferred embodiment, said control means sets a supply amount of said first flow controller to a constant value, and controls an exhaust amount of said second flow controller on the basis of the pressure in the optical path space.

In a preferred embodiment, said control means sets an exhaust amount of said second flow controller to a constant value, and controls a supply amount of said first flow controller on the basis of the pressure in the optical path space.

In a preferred embodiment, wherein said control means controls operation of at least one of said first and second flow controllers on the basis of a position of said stage.

In a preferred embodiment, said control means sets a supply amount of said first flow controller to a constant value, and controls an exhaust amount of said second flow controller on the basis of the position of said stage.

In a preferred embodiment, said control means sets an exhaust amount of said second flow controller to a constant value, and controls a supply amount of said first flow controller on the basis of the position of said stage.

In a preferred embodiment, said control means controls operation of at least one of said first and second flow controllers on the basis of a predetermined gas concentration in the optical path space.

In a preferred embodiment, said control means sets a supply amount of said first flow controller to a constant value, and controls an exhaust amount of said second flow controller on the basis of the predetermined gas concentration in the optical path space.

In a preferred embodiment, said control means sets an exhaust amount of said second flow controller to a constant value, and controls a supply amount of said first flow controller on the basis of the predetermined gas concentration in the optical path space.

In a preferred embodiment, the predetermined gas is either one or a combination of the inert gas and a gas component, other than the inert gas, in an atmosphere.

In a preferred embodiment, said apparatus further comprises pressure measuring means for measuring a pressure around the optical path space, and said control means controls operation of at least one of said first and second flow controllers on the basis of a measurement result of said pressure measuring means.

In a preferred embodiment, said control means sets a supply amount of said first flow controller to a constant value, and controls an exhaust amount of said second flow controller on the basis of the measurement result of said pressure measuring means.

In a preferred embodiment, said control means sets an exhaust amount of said second flow controller to a constant value, and controls a supply amount of said first flow controller on the basis of the measurement result of said pressure measuring means.

In a preferred embodiment, said apparatus further comprises concentration measuring means for measuring a concentration of a predetermined gas around the optical path space, and said control means controls operation of at least one of said first and second flow controllers on the basis of a measurement result of said concentration measuring means.

In a preferred embodiment, said control means sets a supply amount of said first flow controller to a constant value, and controls an exhaust amount of said second flow controller on the basis of the measurement result of said concentration measuring means.

In a preferred embodiment, said control means sets an exhaust amount of said second flow controller to a constant value, and controls a supply amount of said first flow controller on the basis of the measurement result of said concentration measuring means.

In a preferred embodiment, the predetermined gas is either one or a combination of the inert gas and a gas component, other than the inert gas, in an atmosphere.

In still another aspect of the present invention, the foregoing object is attained by providing a control method for an exposure apparatus including a stage, an optical system, and a gas flow forming mechanism which forms a flow of an inert gas in an optical path space, between said stage and said optical system, including a space through which exposure light passes, to project and transfer a pattern formed on a mask onto a substrate by using exposure light, characterized by comprising the steps of:

measuring a pressure in the optical path space; and controlling operation of at least one of first and second flow controllers on the basis of the pressure measured in the measuring step, the first flow controller serving to control a supply amount of the inert gas to said gas flow forming mechanism, and the second flow controller serving to control an exhaust amount of a gas containing the inert gas from said gas flow forming mechanism.

In still another aspect of the present invention, the foregoing object is attained by providing device manufacturing method comprising the steps of:

transferring, by using an exposure apparatus, a pattern onto a substrate applied with a photosensitive material; and developing the substrate, the exposure apparatus including a stage, an optical system, a gas flow forming mechanism which forms a flow of an inert gas in an optical path space, between the stage and the optical system, including a space through which exposure light passes, a first flow controller which controls a supply amount of the inert gas to be supplied to the gas flow forming mechanism, a second flow controller which controls an exhaust amount of a gas containing the inert gas to be exhausted from the gas flow forming mechanism, and controlling means for controlling operation of at least one of the first and second flow controllers.

According to the present invention, the foregoing object is attained by providing an exposure apparatus for projecting and transferring a pattern formed on a mask onto a substrate by using exposure light, comprising a stage, an optical system, a gas flow forming mechanism which forms a flow of an inert gas in an optical path space, between the stage and the optical system, including a space through which exposure light passes, and control means for controlling a flow velocity or pressure of an atmosphere around the gas flow forming mechanism.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

The preferred embodiments of the present invention will be described with reference to the accompanying drawings.

[First Embodiment]

Figure 1:
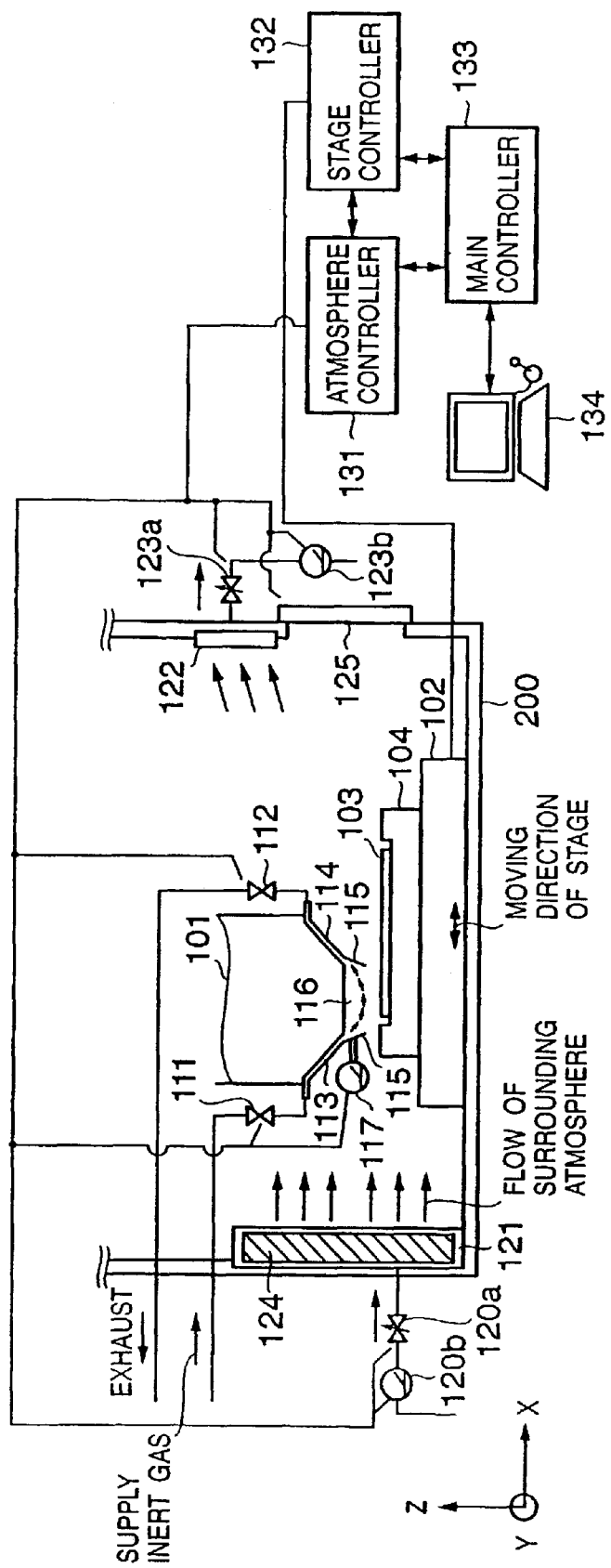
FIG. 1 is a view showing part of an exposure apparatus according to the first embodiment of the present invention.

FIG. 1 is a view showing part of an exposure apparatus according to the first embodiment of the present invention.

This exposure apparatus has a light source (not shown) for generating a short-wavelength laser beam, e.g., an $F_2$ excimer laser, as an illumination beam. The illumination beam (exposure light) from the light source uniformly illuminates a reticle (mask) through an appropriate illumination optical member. The beam (exposure light) transmitted through the reticle reaches the surface of a wafer 103, held by a wafer chuck 104 placed on a wafer stage 102, through various types of optical members that form a projection optical system 101, and forms the image of a reticle pattern there.

The wafer stage 102 can move in a three-dimensional direction (X-Y-Z direction). The reticle pattern is successively projected and transferred onto the wafer 103 by the so-called step-and-repeat method of repeating stepping movement and exposure. When the present invention is applied to a scanning exposure apparatus, the resultant apparatus has almost the same arrangement as that of this exposure apparatus.

During exposure, a temperature-controlled inert gas (e.g., nitrogen gas, helium gas, or the like) is supplied to a space (to be referred to as an optical path space hereinafter) 116, between a shielding member (a partition member) 115 under the projection optical system 101 and the wafer 103, including a space through which the exposure light passes and a portion around it through a supply valve 111. Part of the inert gas supplied to the optical path space 116 is recovered by an exhaust port 114 and exhausted through an exhaust valve 112. The supply valve 111, supply port 113, exhaust port 114, exhaust valve 112, and the like; are examples of a gas flow forming mechanism that forms the flow of a gas such as an inert gas in the optical path space 116.

An exposure apparatus main body including the projection optical system 101, wafer stage 102, wafer chuck 104, and wafer 103 is hermetically sealed in a chamber 200. A supply unit 121 for supplying the temperature control gas (e.g., dry air or a low-concentration inert gas) into the chamber 200 through a filter 124, and an exhaust unit 122 for recovering the gas in the chamber 200 and exhausting it to the outside are formed on the wall surface of the chamber 200.

Arrows in FIG. 1 indicate the flow of the inert gas.

Basically, the oxygen concentration of the exposure atmosphere is decreased by setting the optical path space 116 at a positive pressure with respect to the surrounding atmosphere. For this reason, the supply amount of inert gas leaking from the optical path space 116 to the surrounding space is larger than the exhaust amount exhausted through the exhaust valve 112. Hence, depending on the situation, the final optical member 144 may not sometimes be necessary. Regarding the inert gas leaking to the outside of the optical path space 116, the temperature control gas (dry air or a low-concentration inert gas) is supplied from the supply unit 121 through the filter 124, is recovered by the exhaust unit 122 together with the surrounding atmosphere, and is exhausted. This surrounding atmosphere controls the temperature around the exposure region.

The opening/closing operation and the aperture ratio of the supply valve 111 and exhaust valve 112, a flow controller 120a for controlling the supply amount of the temperature control gas, a flow controller 123a for controlling the exhaust amount of the inert gas or the like, a manometer 117 for measuring the pressure in the optical path space 116, and a wafer exchange door 125 for allowing exchange of the wafer 103 are controlled by an atmosphere controller 131. The flow rates of the flow controllers 120a and 123a are controlled by the atmosphere controller 131 on the basis of the values of flowmeters 120b and 123b. The wafer stage 102 is controlled by a stage controller 132. The atmosphere controller 131, stage controller 132, and other controllers (not shown) are totally controlled by a main controller 133 during various types of operations, e.g., wafer exchange, alignment operation, exposure operation, and the like. The control contents of the main controller 133 and the operating state of the exposure apparatus are monitored by a monitor 134.

The pressure increases slightly at that end of the wafer stage to which the temperature control gas is blown directly. As the wafer stage 102 moves, the pressure distribution around the optical path space 116 changes, and the pressure in the optical path space 116 also changes accordingly. This pressure change changes the inert gas concentration in the optical path space 116, and the inert gas concentration changes and thus is not stable.

According to the first embodiment, the pressure in the optical path space 116 is measured by using the manometer 117, and the flow velocity or pressure of the surrounding atmosphere is controlled in accordance with the measured pressure, thereby stabilizing the inert gas concentration in the optical path space 116.

The flow velocity or pressure of the surrounding atmosphere is controlled by controlling the exhaust amount to be exhausted from the exhaust unit 122 while setting the supply amount of the temperature control gas to be supplied from the supply unit 121 at a constant value. Thus, the concentration of the inert gas in the optical path space 116 can be stabilized. More specifically, since the inert gas concentration in the optical path space 116 is increased when the pressure in the optical path space 116 increases, control operation is performed such that the exhaust amount from the exhaust unit 122 is increased to decrease the inert gas concentration, and is decreased to increase the inert gas concentration when the pressure decreases.

In the first embodiment, the exhaust amount is controlled while setting the supply amount of the temperature control gas to be supplied from the supply unit 121 at a constant value. Conversely, the supply amount may be controlled while setting the exhaust amount at a constant value.

The inert gas concentration in the optical path space 116 is stabilized by measuring the pressure in the optical path space 116 with the manometer 117. This pressure and the position of the wafer stage 102 are correlated to each other. The pressure is high at that end of the wafer stage 102 to which the surrounding atmosphere is blown. As the wafer stage 102 moves, the pressure distribution changes, and accordingly the pressure in the optical path space 116 changes. Therefore, the supply amount or exhaust amount of the surrounding atmosphere may be controlled in accordance with the position of the wafer stage 102.

Alternatively, the supply amount or exhaust amount of the surrounding atmosphere may be controlled in accordance with the moving direction or moving speed of the wafer stage, or in accordance with the position, moving direction, or moving speed of not the wafer stage but the reticle stage.

The inert gas concentration in the optical path space 116 is stabilized by measuring the pressure in the optical path space 116 with the manometer 117. Alternatively, the relationship between the pressure in the optical path space 116 and the inert gas concentration in the optical path space 116 may be obtained. In place of measuring the pressure, the supply amount or exhaust amount of the surrounding atmosphere in the optical path space 116 may be controlled on the basis of a result obtained by measuring the inert gas concentration or the concentrations of other components (e.g., oxygen, carbon dioxide, water, or the like, contained in the atmosphere) in the optical path space 116, thereby stabilizing the inert gas concentration at high precision.

The inert gas concentration is low on the upstream side of the surrounding atmosphere of the optical path space 116, due to the flow of the surrounding atmosphere. When that end of the wafer stage 102 to which the flow of the surrounding atmosphere is blown directly becomes close to the optical path space 116, the inert gas concentration of the surrounding atmosphere becomes further low. If the apparatus has a concentration measurement unit (not shown) for measuring the inert gas concentration of the surrounding atmosphere of the optical path space 116, particularly, the inert gas concentration or the concentrations of other components on the upstream side of the surrounding atmosphere, and the supply amount or exhaust amount of the surrounding atmosphere is controlled on the basis of the measurement result, the inert gas concentration in the optical path space 116 can also be stabilized. In this case, a control operation may be performed such that as the inert gas concentration around the optical path space 116 decreases, the supply amount of the surrounding atmosphere is decreased, or the exhaust amount is decreased. As the inert gas concentration of the surrounding atmosphere increases, the supply and exhaust amount may be controlled to increase the supply amount or to increase the exhaust amount of the surrounding atmosphere.

The pressure is slightly high on the upstream side of the surrounding atmosphere of the optical path space 116, due to the flow of the surrounding atmosphere. When that end of the stage 102 to which the flow of the surrounding atmosphere is blown directly becomes close to the optical path space 116, the pressure of the surrounding atmosphere further increases slightly. If the apparatus has a manometer (not shown) for measuring the pressure of the portion around the optical path, particularly, the pressure on the upstream side of the surrounding atmosphere, and the supply amount or exhaust amount of the surrounding atmosphere is controlled on the basis of the measurement result, the inert gas concentration in the optical path space 116 can also be stabilized. In this case, a control operation may be performed such that as the pressure around the optical path space 116 increases, the supply amount of the surrounding atmosphere is decreased, or the exhaust amount is decreased. A control operation may be performed such that as the pressure around the optical path space 116 decreases, the supply amount of the surrounding atmosphere is increased, or the exhaust amount is increased.

[Second Embodiment]

In the first embodiment, the surrounding atmosphere flows in the horizontal direction. In contrast to this, the second embodiment deals with a case wherein the surrounding atmosphere flows in the vertical direction.

Figure 2:
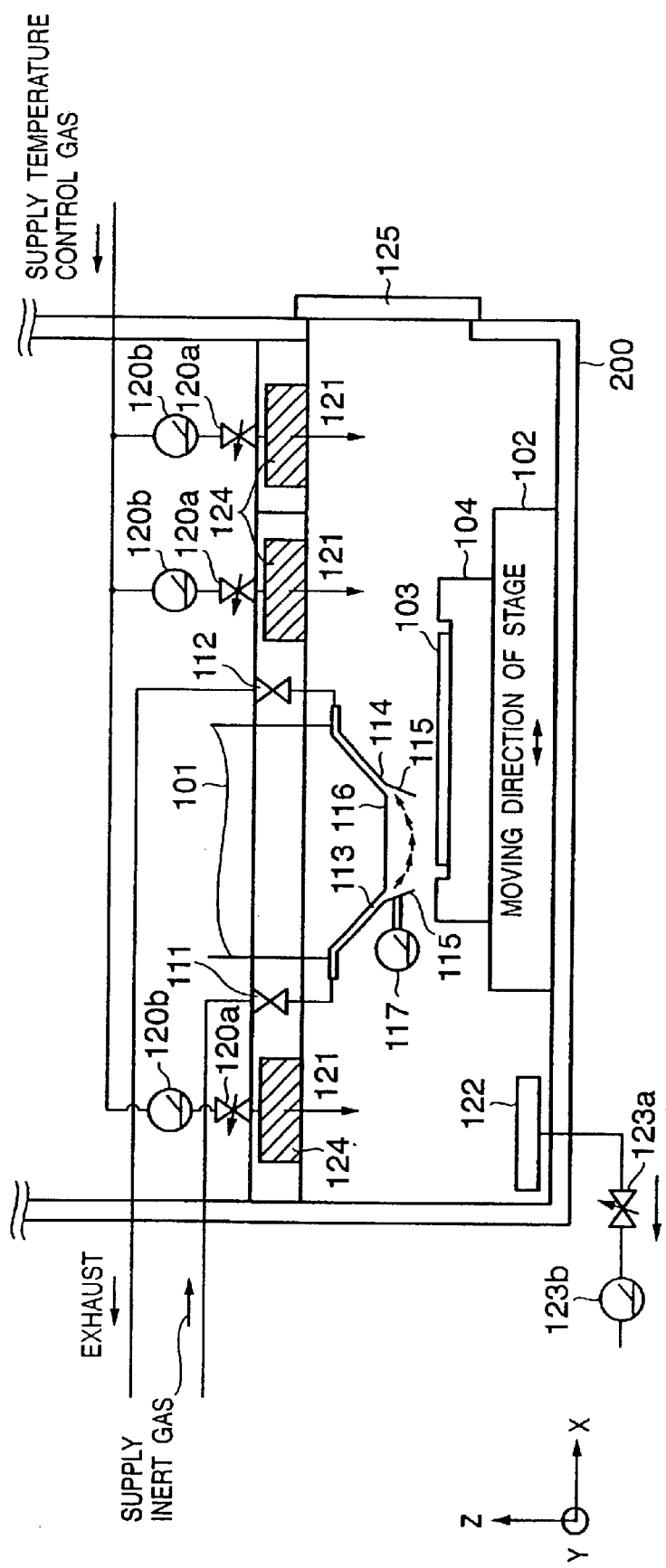
FIG. 2 is a view showing part of an exposure apparatus according to the second embodiment of the present invention.

The most characteristic feature of the second embodiment resides in that, as shown in FIG. 2, each of a plurality of supply units 121 provided around a projection optical system 101 to form a supply unit group has a flow controller 120a and flowmeter 120b. The flow controllers 120a are controlled by an atmosphere controller 131 on the basis of the values of the corresponding flowmeters 120b.

In FIG. 2, those constituent elements which are common with FIG. 1 are denoted by the same reference numerals as in FIG. 1. The atmosphere controller 131, a stage controller 132, a main controller 133, a monitor 134, and the like, are omitted.

The flow velocities (flow rates) of the controllers 120a provided to the respective supply units 121 that form the supply unit 121 group can be controlled separately by the atmosphere controller 131. In the same manner as in the first embodiment, the exhaust amount may be set at a constant value in accordance with the pressure in an optical path space 116 or the position of a wafer stage 102, and the supply amount may be controlled at once. Alternatively, the supply amount may be set at a constant value, and the exhaust amount may be controlled. In the second embodiment, the flow velocity distribution of the surrounding atmosphere is changed in accordance with the position of the wafer stage 102, thereby stabilizing the inert gas concentration in the optical path space 116.

As described also in the first embodiment, a temperature control gas (dry air or a low-concentration inert gas) is supplied from the supply unit 121 group and flows to around the optical path space 116. The pressure slightly increases around that surface of the wafer stage 102 to which the supplied temperature control gas is blown directly, and as the wafer stage 102 moves, the pressure distribution around the optical path space 116 changes. Accordingly, the pressure in the optical path space 116 also changes.

In view of this, the supply amount from the supply unit 121 present above the surface of the wafer stage 102 may be suppressed, while the supply amounts from the remaining supply units 121 are increased, so the flow rate of the total temperature control gas is set constant, thereby stabilizing the pressure in the optical path space 116. As a result, the inert gas concentration in the optical path space 116 can be stabilized.

The second embodiment shows how to control the supply amount of the surrounding atmosphere in accordance with the position of the wafer stage 102. Alternatively, the flow velocity distribution of the surrounding atmosphere may be controlled in accordance with the pressure in the optical path space 116. In this case, as the pressure in the optical path space 116 increases, the flow rate of the surrounding atmosphere is so controlled as to increase in the vicinity of the optical path space 116. As the pressure in the optical path space 116 decreases, the flow rate of the surrounding atmosphere is so controlled as to decrease in the vicinity of the optical path space 116. Thus, the pressure in the optical path space 116 is kept at a constant value. As a result, the concentration in the optical path space 116 is stabilized.

Alternatively, the supply amount of the surrounding atmosphere may be controlled in accordance with the concentration of a predetermined gas in the optical path space 116. In this case, as the inert gas concentration in the optical path space 116 decreases, the flow rate of the surrounding atmosphere is so controlled as to decrease in the vicinity of the optical path space 116. As the inert gas concentration in the optical path space 116 increases, the flow rate of the surrounding atmosphere is so controlled as to increase in the vicinity of the optical path space 116. Thus, the concentration in the optical path space 116 is stabilized.

[Third Embodiment]

Figure 3:
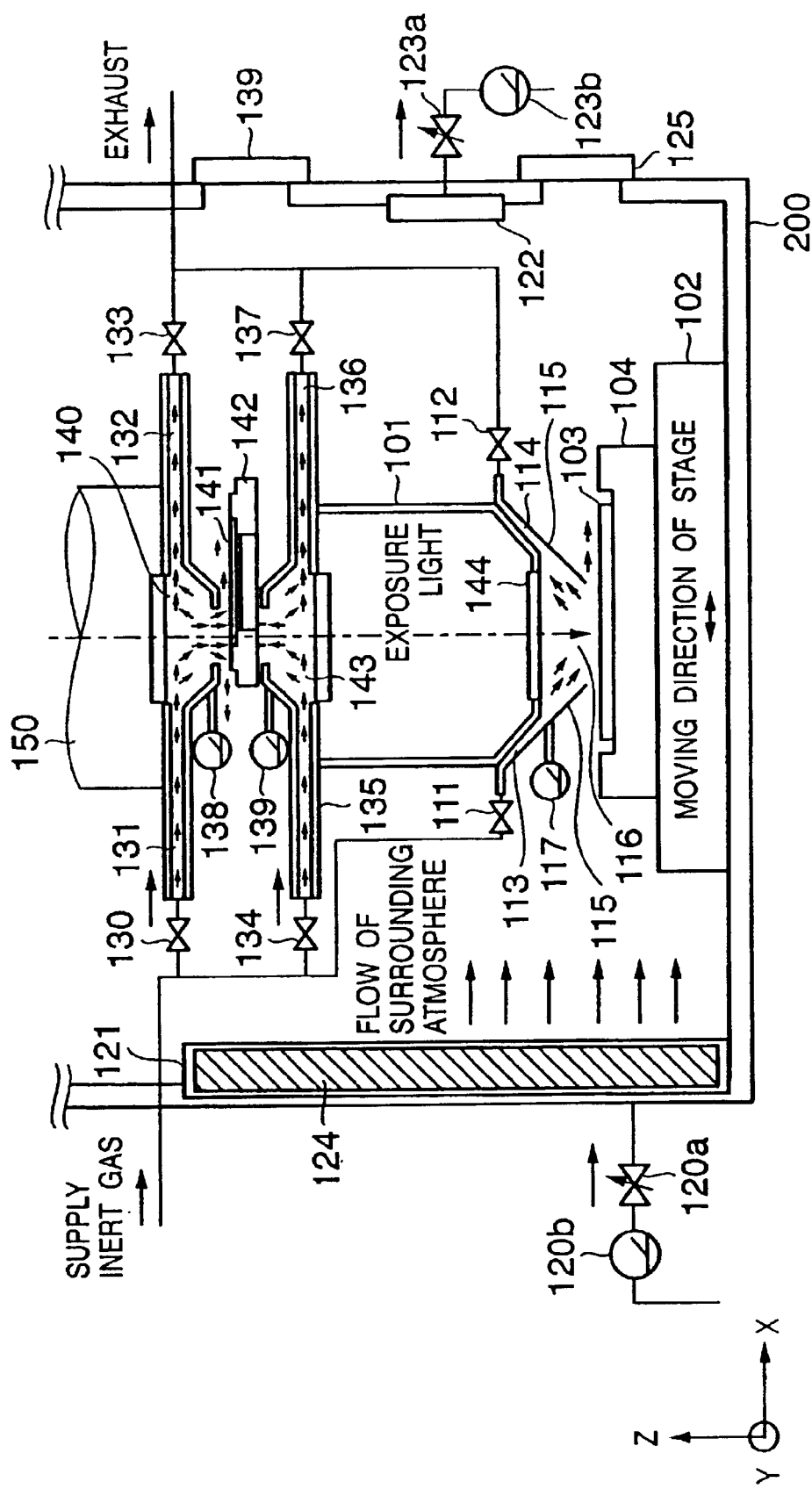
FIG. 3 is a view showing part of an exposure apparatus, including a portion around a reticle, according to the third embodiment of the present invention.

The present invention applied to the relationship between the projection optical system and wafer stage in the first and second embodiments can also be applied to the relationship between the illumination optical system and reticle stage and that between the reticle stage and projection optical system. FIG. 3 shows an exposure apparatus in which the present invention is applied to the relationship between the projection optical system and wafer stage, that between the illumination optical system and reticle stage, and that between the reticle stage and projection optical system.

In FIG. 3, those constituent elements which are common with FIG. 1 are denoted by the same reference numerals as in FIG. 1. An atmosphere controller 131, stage controller 132, main controller 133, monitor 134, and the like, are omitted.

In the exposure apparatus shown in FIG. 3, regarding a first optical path space 116 between a final optical member (cover glass) 144 of a projection optical system 101 and a wafer chuck 104 (wafer 103), a first supply port 113 for supplying an inert gas to it through a supply valve 111 and an exhaust valve 112 for exhausting the inert gas or the like from it through a first exhaust port 114 are provided for it.

Regarding a second optical path space 140 between an illumination optical system 150 for illuminating a reticle (mask) 141 and a reticle stage 142 (reticle 141), a second supply port 131 for supplying the inert gas to it through a supply valve 130 and an exhaust valve 133 for exhausting the inert gas or the like from it through a second exhaust port 132 are provided for it.

Regarding a third optical path space 143 between the reticle stage 142 and projection optical system 101, a third supply port 135 for supplying the inert gas to it through a supply valve 134 and an exhaust valve 137 for exhausting the inert gas or the like from it through a third exhaust port 136 are provided for it.

The pressures in the first to third optical path spaces (116, 140, and 143) are measured by using first to third manometers (117, 138, and 139), and the flow velocity of the surrounding atmosphere or the pressure is controlled in accordance with the measured pressures, thereby stabilizing the inert gas concentrations in the first to third optical path spaces (116, 140, and 143).

The surrounding atmosphere is controlled in the same manner as in the first embodiment.

In FIG. 3, the reticle stage 142 is controlled by the stage controller 132 in synchronism with a wafer stage 102. A flow controller 120*a* for controlling the supply amount of the temperature control gas, a flow controller 123*a* for controlling the exhaust amount of the inert gas or the like, a wafer exchange door 125 for allowing exchange of the wafer 103, a reticle exchange door 139 for allowing exchange of the reticle 141, the first to third manometers (117, 138, and 139), the first to third supply valves (111, 130, and 134), and the first to third exhaust valves (112, 133, and 137) are controlled by the atmosphere controller 131. The atmosphere controller 131, stage controller 132, and other controllers (not shown) are totally controlled by the main controller 133 during various types of operations, e.g., wafer exchange, alignment operation, exposure operation, and the like. The control content of the main controller 133 and the operating state of the exposure apparatus are monitored by the monitor 134.

In FIG. 3, the pressure around the reticle stage 142 and that around the wafer stage 102 are controlled on the basis of the supply amount from a supply unit 121 or the exhaust amount of an exhaust unit 122. It is, however, difficult to control the surrounding atmosphere in accordance with the operations of the respective stages by using the same supply or exhaust ports. For this reason, supply ports for supplying the surrounding atmosphere, exhaust ports, or supply/exhaust ports are provided separately to the reticle stage 142 and wafer stage 102, and the same control operation for the first embodiment is performed. Then, the inert gas concentrations in the first to third optical path spaces (116, 140, and 143) can be stabilized better.

[Fourth Embodiment]

Figure 4:
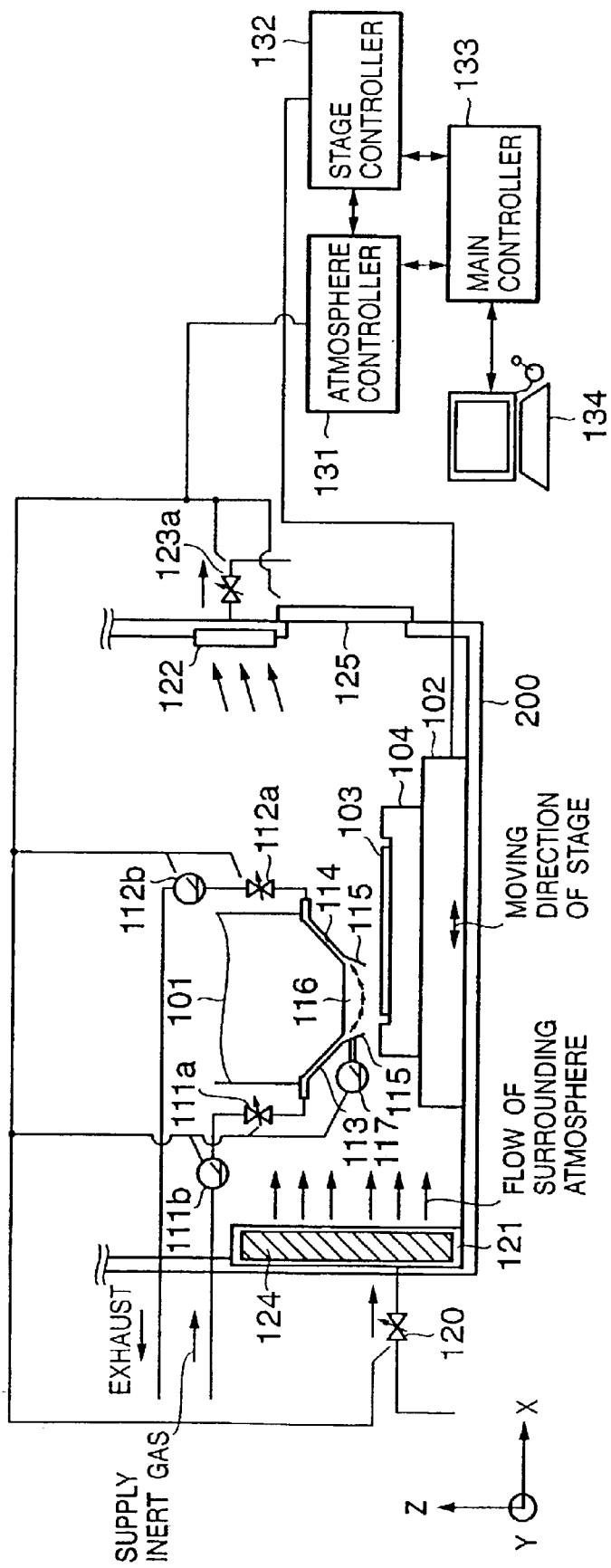
FIG. 4 is a view showing part of an exposure apparatus according to the fourth embodiment of the present invention.

FIG. 4 is a view showing part of an exposure apparatus according to the fourth embodiment of the present invention.

In FIG. 4, those constituent elements which are common with FIG. 1 are denoted by the same reference numerals as in FIG. 1.

During exposure, a temperature-controlled inert gas (e.g., nitrogen gas, helium gas, or the like) is supplied from a supply port 113 to an optical path space between a shielding member 115 under a projection optical system 101 and a wafer 103 through a first flow controller 111*a*. Part of the inert gas supplied to the optical path space 116 is recovered by an exhaust port 114 and exhausted through a second flow controller 112*a*. The first flow controller 111*a*, supply port 113, exhaust port 114, second flow controller 112*a*, and the like, are examples of a gas flow forming mechanism that forms the flow of a gas such as the inert gas in the optical path space 116.

The flow rates of the first and second flow controllers 111a and 112a are controlled by an atmosphere controller 131 on the basis of the measurement values of corresponding first and second flowmeters 111b and 112b.

Basically, the oxygen concentration of the exposure atmosphere is decreased by setting the optical path space 116 at a positive pressure with respect to the surrounding atmosphere. For this reason, the supply amount of inert gas leaking from the optical path space 116 to the surrounding space is larger than the exhaust amount exhausted through the second flow controller 112a. Regarding the inert gas leaking to the outside of the optical path space 116, the temperature control gas (dry air or a low-concentration inert gas) through a supply valve 120 is supplied from the supply unit 121 through the filter 124, is recovered by the exhaust unit 122 together with the surrounding atmosphere, and is exhausted from an exhaust valve 123. This surrounding atmosphere controls the temperature around the exposure region.

The first flow controller 111a for controlling the supply amount of the inert gas, the second flow controller 112a for controlling the exhaust amount of the gas containing the inert gas, the opening/closing operation and the aperture ratio of a supply valve 120 and exhaust valve 123, a manometer 117 for measuring the pressure in the optical path space 116, and a wafer exchange door 125 for allowing exchange of the wafer 103 are controlled by an atmosphere controller 131. A wafer stage 102 is controlled by a stage controller 132.

According to the fourth embodiment, the pressure in the optical path space 116 is measured by using the manometer 117, and the supply amount of the inert gas to the optical path space 116, or the exhaust amount of the gas containing the inert gas from the optical path space 116 is controlled in accordance with the measured pressure, thereby stabilizing the inert gas concentration in the optical path space 116.

Regarding a control operation of the supply amount or exhaust amount, for example, as the wafer stage 102 moves, the supply amount may be controlled, if the exhaust amount is set at a constant value, and the exhaust amount may be controlled, if the supply amount is set at a constant value, thereby stabilizing the inert gas concentration in the optical path space 116.

According to the fourth embodiment, the inert gas concentration in the optical path space 116 is stabilized by measuring the pressure in the optical path space 116 with the manometer 117. This pressure and the position of the wafer stage 102 are correlated to each other. The pressure is high at that end of the wafer stage 102 to which the surrounding atmosphere is blown. As the wafer stage 102 moves, the pressure distribution changes, and accordingly the pressure in the optical path space 116 changes. Therefore, the supply amount of the inert gas to the optical path space 116 or the exhaust amount of the gas containing the inert gas from the optical path space 116 is controlled in accordance with the position of the wafer stage 102, thereby stabilizing the inert gas concentration in the optical path space 116.

Alternatively, the supply amount or exhaust amount of the optical path space 116 may be controlled in accordance with the moving direction or moving speed of the wafer stage, or in accordance with the position, moving direction, or moving speed of not the wafer stage but the reticle stage.

The inert gas concentration in the optical path space 116 is stabilized by measuring the pressure in the optical path space 116 with the manometer 117. Alternatively, the relationship between the pressure in the optical path space 116 and the inert gas concentration in the optical path space 116 may be obtained. In place of measuring the pressure, the supply amount of the inert gas to the optical path space 116 or the exhaust amount of the gas containing the inert gas from the optical path science 116 may be controlled on the basis of a result obtained by measuring the inert gas concentration or the concentrations of other components (e.g., oxygen, carbon dioxide, water, or the like, contained in the atmosphere) in the optical path space 116, so the inert gas concentration in the optical path space 116 is stabilized at high precision.

Alternatively, in place of measuring the pressure in the optical path space 116 with the manometer 117, a manometer may be provided somewhere around the optical path space 116. The supply amount of the inert gas to the optical path space 116 or the exhaust amount of the gas containing the inert gas from the optical path space 116 may be controlled in accordance with a change in the surrounding pressure, thereby stabilizing the inert gas concentration in the optical path space 116. As described above, the pressure is high at that end of the wafer stage 102 to which the surrounding atmosphere is blown. As the wafer stage 102 moves, the pressure distribution changes. Hence, the pressure and concentration in the optical path space 116 change in accordance with the pressure change around the optical path space 116. For this reason, since the surrounding atmosphere easily comes in the optical path space 116 when the pressure around the optical path space 116 increases, a control operation may be performed to increase the supply amount or decrease the exhaust amount so the pressure in the optical path space 116 increases. When the pressure around the optical path space 116 decreases, a control operation may be performed to decrease the supply amount or to increase the exhaust amount so the pressure in the optical path space 116 decreases.

Alternatively, in place of measuring the inert gas concentration or the concentrations of other components (e.g., oxygen, carbon dioxide, water, or the like, contained in the atmosphere) in the optical path space 116, the supply amount of the inert gas to the optical path space 116 or the exhaust amount of the gas containing the inert gas from the optical path space 116 may be controlled on the basis of the result obtained by measuring the inert gas concentration or the concentrations of other components around the optical path space 116, thereby stabilizing the inert gas concentration in the optical path space 116.

The inert gas concentration is low on the upstream side of the surrounding atmosphere. When that end of the stage 102 to which the flow of the surrounding atmosphere is blown directly becomes close to the optical path space 116, the inert gas concentration of the surrounding atmosphere becomes further low. If the supply amount of the inert gas to the optical path space 116 or the exhaust amount of the gas containing the inert gas from the optical path space 116 is controlled on the basis of the result obtained by measuring the inert gas concentration of the atmosphere around the optical path space 116, particularly, the inert gas concentration or the concentrations of other components on the upstream side of the surrounding atmosphere, the inert gas concentration in the optical path space 116 can also be stabilized. In this case, as the inert gas concentration around the optical path space 116 decreases, a control operation may be performed to increase the supply amount or decrease the exhaust amount to/from the optical path space 116 so the pressure in the optical path space 116 increases. As the inert gas concentration around the optical path space 16 increases, a control operation may be performed to decrease the supply amount or to increase the exhaust amount to/from the optical path space so the pressure in the optical path space 116 decreases.

[Fifth Embodiment]

Figure 5:
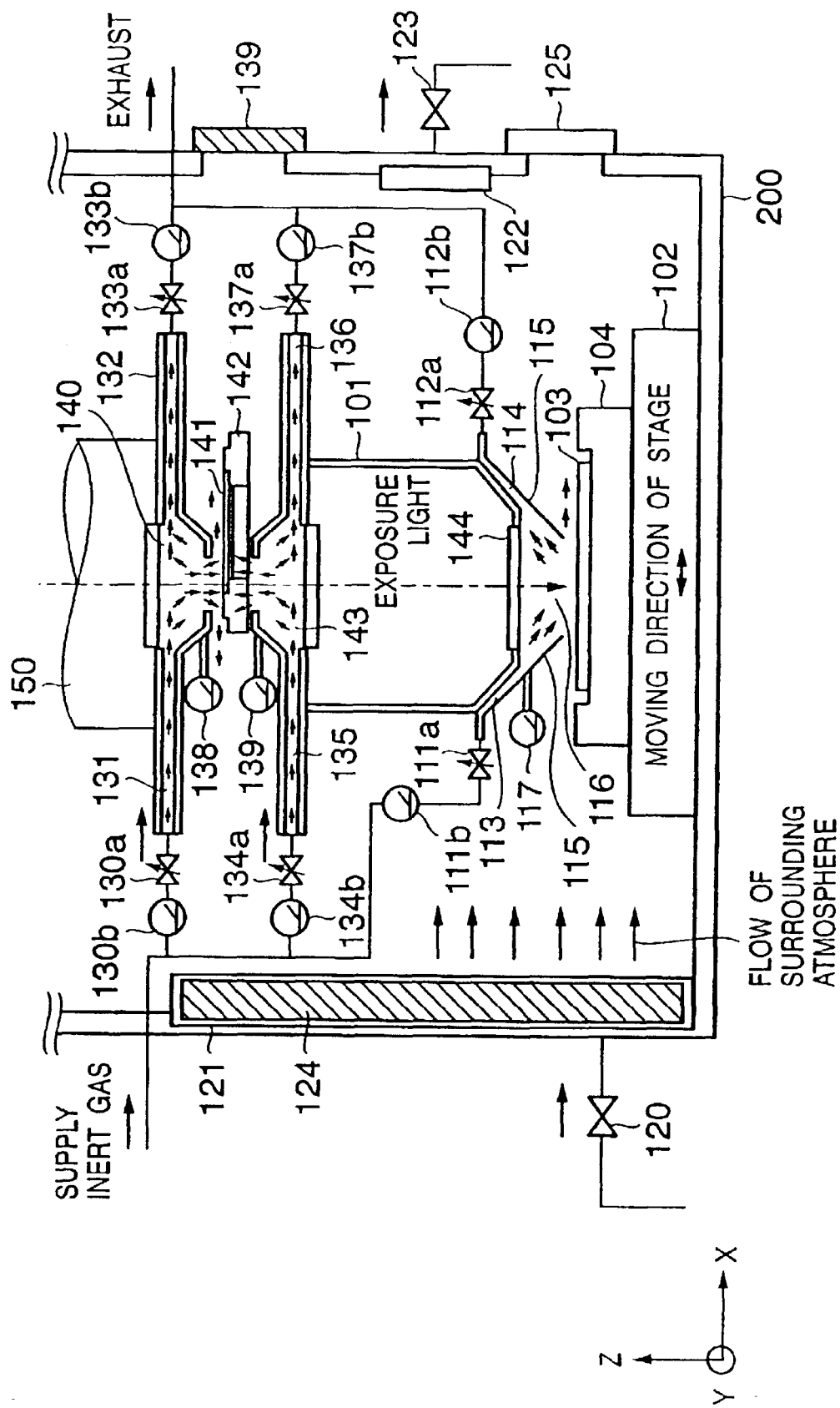
FIG. 5 is a view showing part of an exposure apparatus, including a portion around a reticle, according to the fifth embodiment of the present invention.

The present invention applied to the relationship between the projection optical system and wafer stage in the fourth embodiment can also be applied to the relationship between the illumination optical system and the reticle stage and that between the reticle stage and the projection optical system. FIG. 5 shows an exposure apparatus in which the present invention is applied to the relationship between the projection optical system and the wafer stage, that between the illumination optical system and the reticle stage, and that between the reticle stage and the projection optical system.

In FIG. 5, those constituent elements which are common with FIGS. 3 and 4 are denoted by the same reference numerals as in FIGS. 3 and 4. An atmosphere controller 131, stage controller 132, main controller 133, monitor 134, and the like, are omitted.

In the exposure apparatus shown in FIG. 5, regarding a first optical path space 116, a first supply port 113 for supplying an inert gas to it through a first flow controller 111a and a second flow controller 112a for exhausting the inert gas or the like from it through a first exhaust port 114 are provided for it.

Regarding a second optical path space 140, a second supply port 131 for supplying the inert gas to it through a third flow controller 130a and a fourth flow controller 133a for exhausting the inert gas or the like from it through a second exhaust port 132 are provided for it.

Regarding a third optical path space 143, a third supply port 135 for supplying the inert gas to it through a fifth flow controller 134a and a sixth flow controller 137a for exhausting the inert gas or the like from it through a third exhaust port 136 are provided for it.

The pressures in the first to third optical path spaces (116, 140, and 143) are measured by using first to third manometers (117, 138, and 139), and the supply amount of the inert gas to each one of the first to third optical path spaces (116, 140, and 143) or the exhaust amount of the gas containing the inert gas from each optical path is controlled in accordance with the measured pressures, thereby stabilizing the inert gas concentrations in the first to third optical path spaces (116, 140, and 143). The supply amount or exhaust amount is controlled in the same manner as in the first embodiment.

In FIG. 5, a supply valve 120 for supplying the supply amount of the temperature control gas, an exhaust valve 123 for controlling the exhaust amount of the inert gas or the like, a wafer exchange door 125 for allowing exchange of a wafer 103, a reticle exchange door 139 for allowing exchange of a reticle 141, the first to third manometers (117, 138, and 139), and the first to sixth flow controllers (111a, 112a, 130a, 133a, 134a, and 137a) are controlled by the atmosphere controller 131 on the basis of the measurement values of corresponding first to sixth flowmeters (111b, 112b, 130b, 133b, 134b, and 137b).

[Sixth Embodiment]

Figure 8:
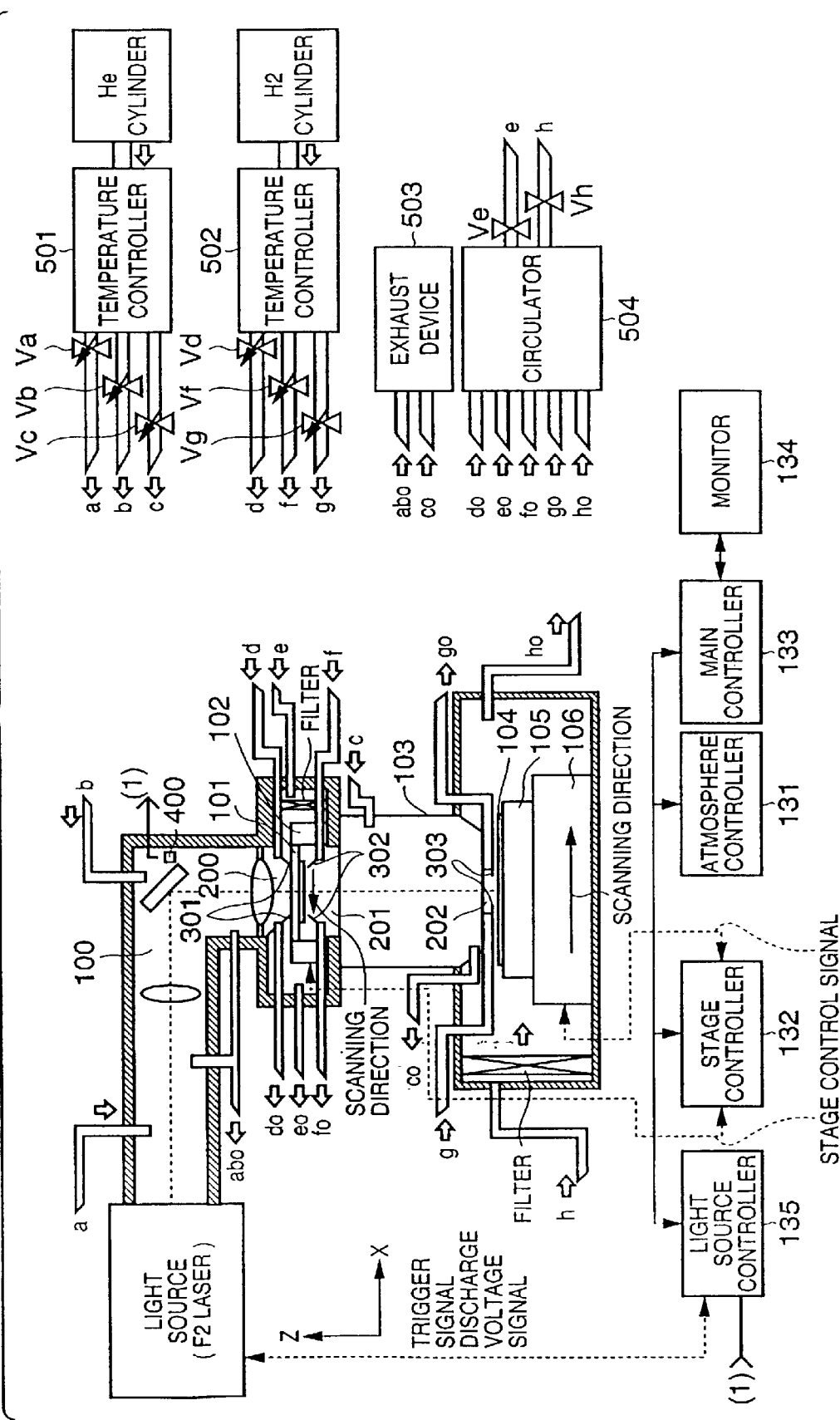
FIG. 8 is a view showing an exposure apparatus according to the sixth embodiment of the present invention.

FIG. 8 is a view showing the sixth embodiment of the present invention.

FIG. 8 is a schematic view showing an arrangement from the light source to the projection optical system (lens barrel) of an exposure apparatus, an arrangement around a wafer, and a control system.

This exposure apparatus comprises a light source such as an $F_2$ excimer laser which emits a short-wavelength laser beam as illumination light. This light source emits illumination light (exposure light) to uniformly illuminate via a proper illumination optical system a reticle 101 (mask) fixed to a reticle chuck (not shown) mounted on a reticle stage 102. Light (exposure light) having passed through the reticle 101 reaches, via various optical members which constitute a projection optical system 103, the surface of a wafer 104 held by a wafer chuck 105 mounted on a wafer stage 106. The light forms the pattern of the reticle 101 on the wafer 104.

A sensor 400 mounted in an illumination optical system 100 is an exposure amount detector, which monitors some rays of pulsed light split by a half-mirror. A light source controller 135 controls the pulse energy and emission interval of the $F_2$ laser serving as a light source in response to a discharge voltage signal and trigger signal in accordance with a desired exposure amount. To generate a discharge voltage signal and trigger signal, the measurement result of the sensor 400, a current stage position signal from a stage controller 132, and log information from the main control system are used as parameters.

An inert gas (e.g., nitrogen gas, helium gas, or the like) is supplied from a cylinder to the illumination optical system 100 and projection optical system 103 via a temperature controller 501, valves Va, Vb, and Vc, and flow paths a, b, and c. The inert gas is exhausted by an exhaust device 503 via flow paths abo and co. As a result, the interior of each vessel is purged with high-concentration helium gas.

A temperature-controlled inert gas (e.g., nitrogen gas, helium gas, or the like) is supplied via a temperature controller 502, valves Vd, Vf, and Vg, and flow paths d, e, f, and g to a space (to be referred to as an optical path space 200 hereinafter), between a shielding member 301 under the illumination optical system and a reticle 101, including a space through which exposure light passes and a portion around it, to a space (to be referred to as an optical path space 201 hereinafter), between a shielding member 302 above the projection optical system 103 and the reticle 101, including a space through which exposure light passes and a portion around it, and to a space (to be referred to as an optical path space 202 hereinafter), between a shielding member 303 below the projection optical system 103 and the wafer 104, including a space through which exposure light passes and a portion around it.

Part of nitrogen gas supplied to the optical path spaces is exhausted by an exhaust port, and recovered by a circulator 504 via do, eo, fo, go, and ho. The recovered inert gas is supplied as a temperature control atmosphere around the reticle stage 102 and wafer stage 106 via valves Ve and Vh and a filter.

The valves, exhaust device 503, and circulator 504 are controlled by an atmosphere controller 131. The circulator 504 controls the concentration and temperature of supplied nitrogen gas, and stabilizes the concentration and temperature of an atmosphere around the reticle 101 and wafer 104. Nitrogen gas is supplied from a cylinder, and nitrogen gas supplied to each optical path space is higher in concentration than nitrogen gas supplied via the circulator 504.

In this arrangement, the space is purged with two inert gases: helium gas and nitrogen gas. The interior may be purged with only one gas.

The temperature may be controlled using dry air or low-concentration nitrogen gas, and such inert gas may be supplied around the stage without using the circulator.

The reticle stage 102 and the wafer stage 106 are controlled by the stage controller 132. The reticle stage 102 is movable in the X direction, whereas the wafer stage 106 is movable in the three-dimensional directions (X, Y, and Z directions). The pattern of the reticle 101 is sequentially projected and transferred to the wafer 104 by the so-called step-and-scan method of repeating stepping movement and scanning exposure.

The light source controller 135, stage controller 132, atmosphere controller 131, and alignment controller (not shown) are totally controlled by a main controller 133 during various types of operations, e.g., wafer exchange, alignment operation, exposure operation, and the like. The control contents of the main controller 133 and the operating state of the exposure apparatus are monitored by a monitor 134.

The oxygen concentration of the exposure atmosphere in the optical path space is decreased by setting the internal pressure of each optical path space to a positive pressure with respect to the surrounding atmosphere. For this reason, the amount of inert gas exhausted outside the optical path space is larger than the amount of inert gas exhausted from each optical path space. More specifically, in the reticle stage 102, the sum of the flow rates of nitrogen gas exhausted via the flow paths do and fo is larger than the flow rate of nitrogen gas exhausted via the flow path eo. In the wafer stage 106, the flow rate of nitrogen gas exhausted via the flow path go is larger than the flow rate of nitrogen gas exhausted via the flow path ho.

Figure 16:
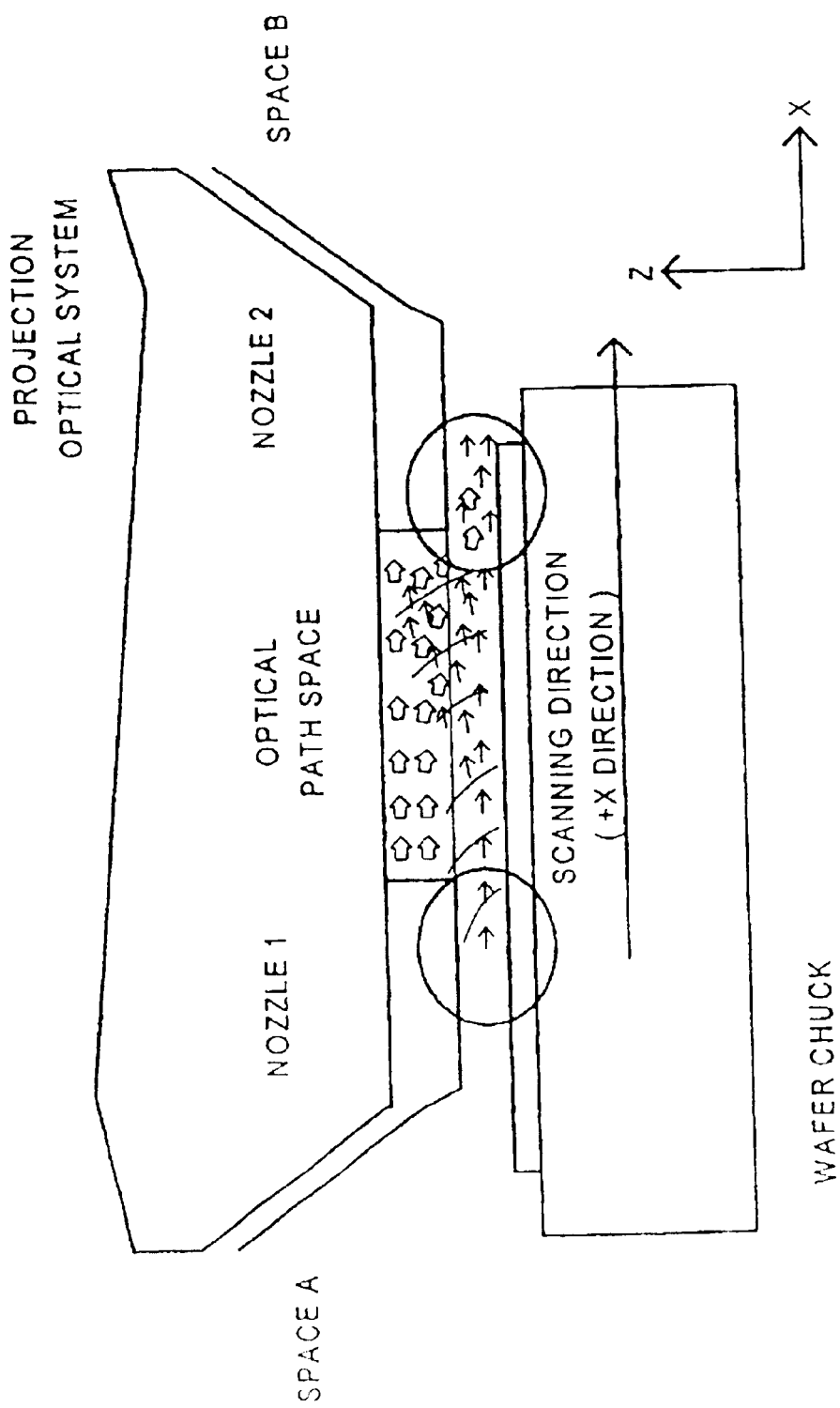
FIG. 16 is a view for explaining the prior art arrangement when the stage is moved in the +X direction.
Figure 17:
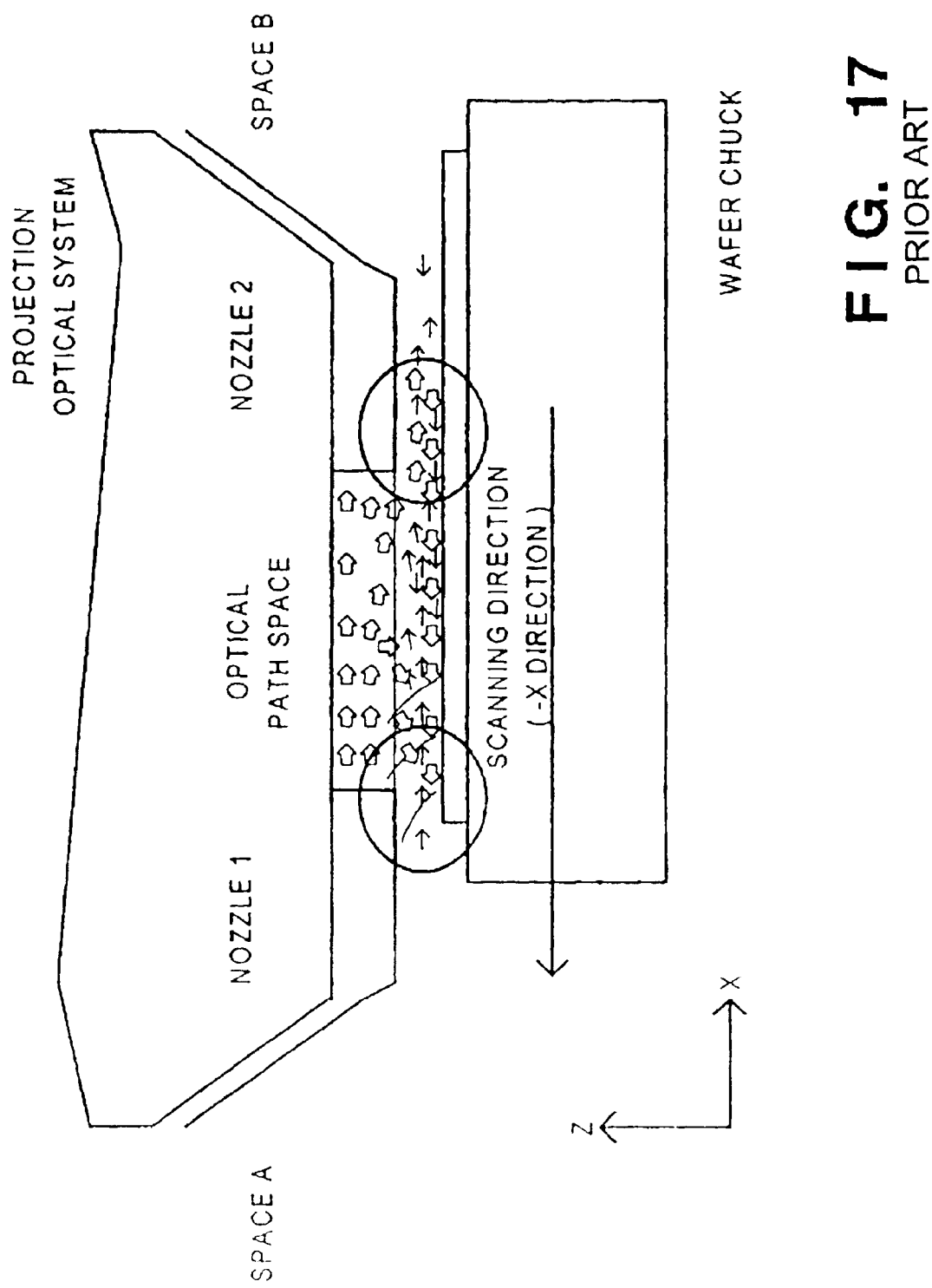
FIG. 17 is a view for explaining the prior art arrangement when the stage is moved in the −X direction.

Around the wafer stage, nitrogen gas leaks along an ambient flow, as shown in FIGS. 16 and 17. A comparison between the nitrogen gas concentration in a space (space A) between nozzle 1 and the wafer and the nitrogen gas concentration in a space (space B) between nozzle 2 and the wafer reveals a higher nitrogen gas concentration in space B. When the wafer stage 106 moves in the +X direction, the entrainment amount from space A becomes larger. When the wafer stage 106 moves in the −X direction, the entrainment amount from space B becomes larger. The difference in the concentration of the entrained atmosphere changes the nitrogen gas concentration in the optical path space 202.

Figure 9:
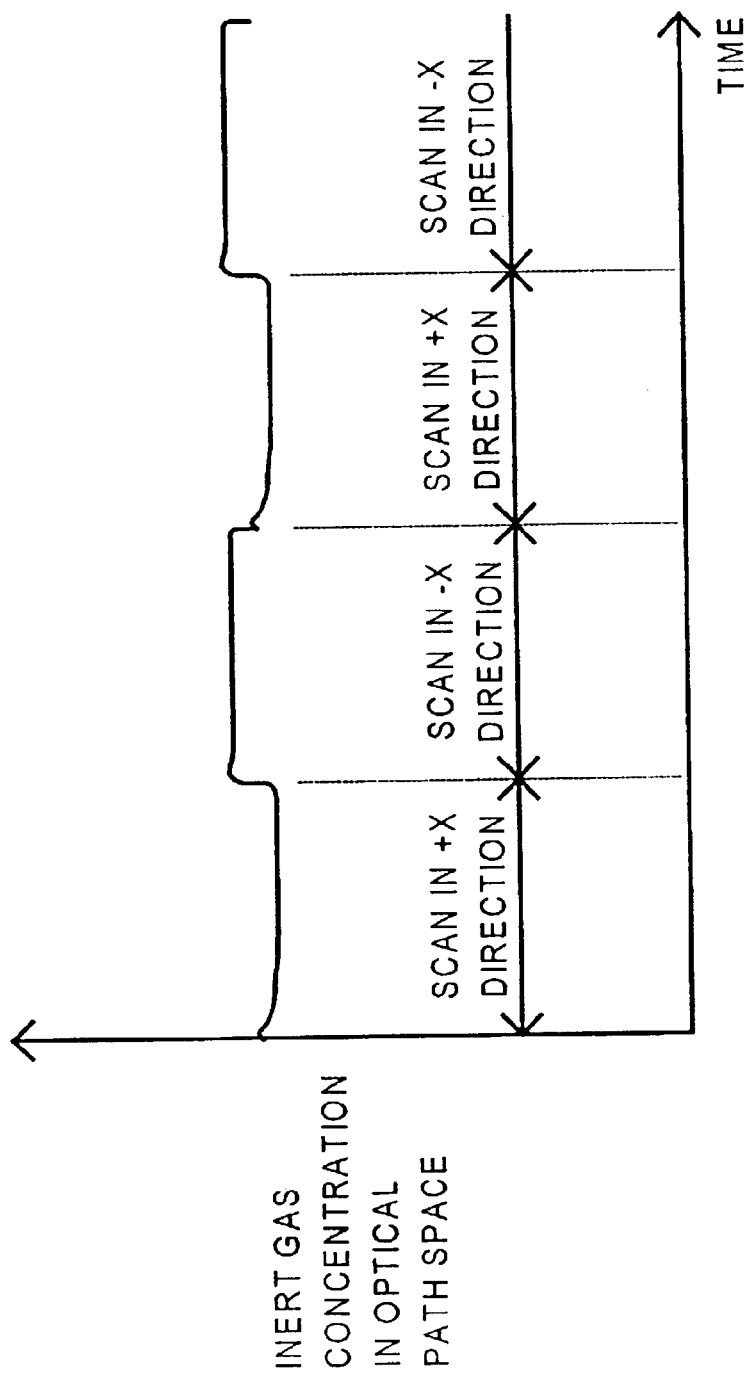
FIG. 9 is a graph showing a temporal change in inert gas concentration in the optical path space according to the sixth embodiment of the present invention.

FIG. 9 shows a change in nitrogen gas concentration in the optical path space along with the movement of the wafer stage. The change in FIG. 9 is the result of simulating the inert gas concentration in the optical path space when the stage is moved on the basis of the size of the space around the wafer, the flow velocity and concentration of a supplied gas, the stage moving speed, and the like.

Figure 10:
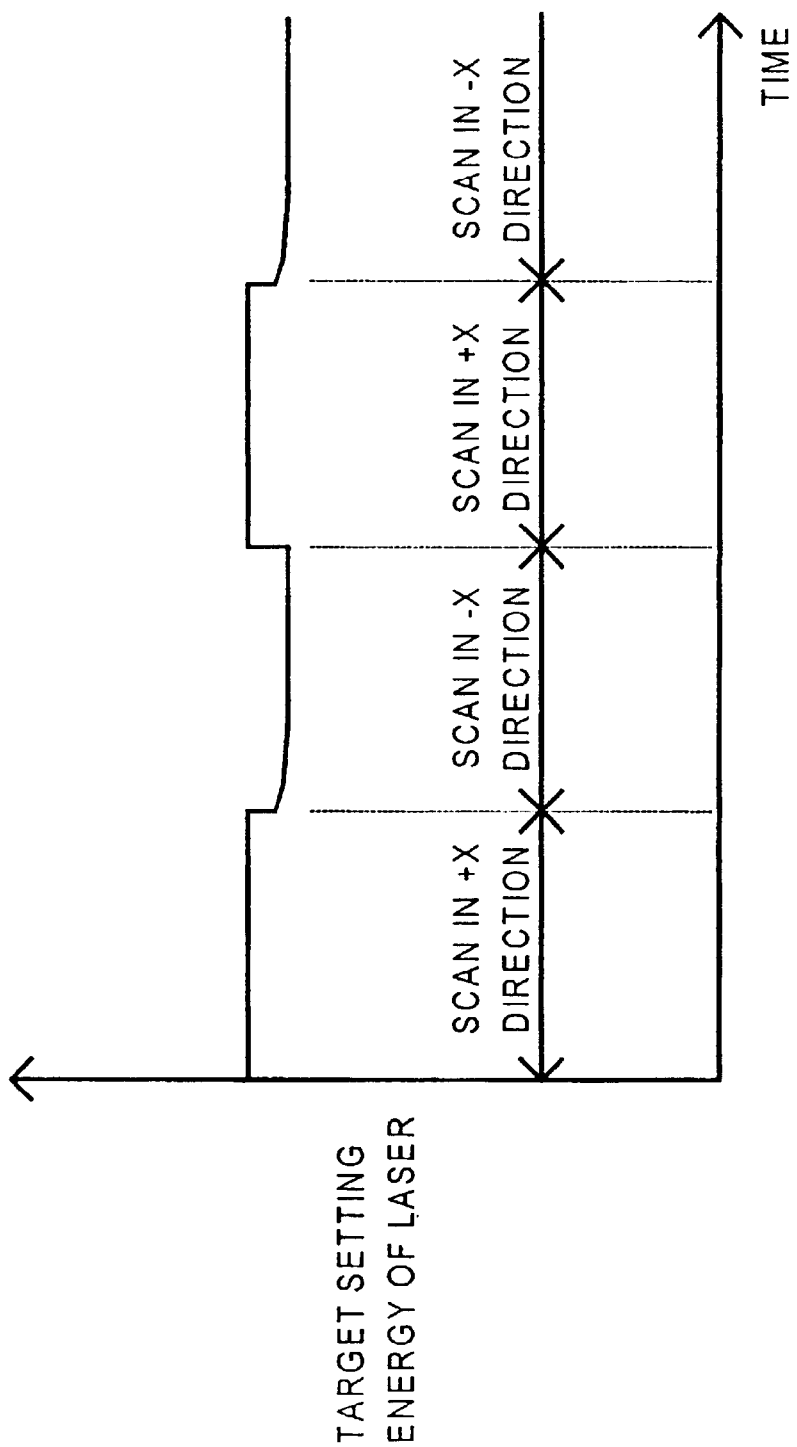
FIG. 10 is a graph showing setting of the target setting energy of a laser serving as a light source according to the sixth embodiment of the present invention.

From FIG. 9, the concentration changes every time the scanning direction is switched. The target setting energy of the laser is set in correspondence with the scanning direction of the stage, as shown in FIG. 10. In +X scanning, the target setting energy of the laser is set high because the inert gas concentration in the optical path space decreases and the transmittance of exposure light in the optical path space decreases. In −X scanning, the target energy of the laser is set low because the inert gas concentration in the optical path space increases and the transmittance in the optical path space increases.

The exposure amount on the wafer surface is stabilized by changing the target setting energy of the laser in correspondence with the stage moving direction.

The state in FIG. 9 is obtained by simulation. The laser energy may be controlled by estimation based on the exposure result on the wafer surface. Alternatively, the laser energy or the like may be controlled in real time on the basis of the result of measuring a change in concentration by connecting a concentration sensor to the optical path space.

In scanning exposure, the wafer stage moves along the +X-axis, while the reticle stage moves along the −X-axis. A surrounding temperature control gas flows along the +X-axis on the wafer stage and the −X-axis on the reticle stage.

In this arrangement, the nitrogen gas concentrations in the optical path spaces 200, 201, and 202 change as follows. The nitrogen gas concentrations in the optical path spaces 201 and 202 decrease when the concentration in the optical path space 200 decreases, and increase when the concentration in the optical path space 200 increases. The target setting energy of the laser is set in consideration of the concentration change amounts in the optical path spaces 200 and 201. This enables higher-precision exposure amount control on the wafer surface.

The sixth embodiment realizes high-precision exposure amount control by adjusting the laser energy. The same effects can also be attained by controlling the emission interval of the laser. In this case, for a high target setting energy of the laser, the emission interval is set small to increase the number of pulses emitted to the same exposure area. For a low target setting energy of the laser, the emission interval is set large to decrease the number of pulses emitted to the same exposure area. As a result, the exposure amount on the wafer surface is stabilized. Alternatively, the light quantity may be adjusted using an optical filter. In this case, a filter is arranged in the illumination optical system 100 in FIG. 8, and the transmittance of the filter is changed stepwise, thereby obtaining the same effects as those of controlling the laser energy or emission interval.

The same effects can also be attained by changing the stage moving speed in correspondence with the scanning direction. In this case, for a high target setting energy of the laser, the stage moving speed is set low to increase the number of pulses emitted to the same exposure area. For a low target setting energy of the laser, the stage moving speed is set high to decrease the number of pulses emitted to the same exposure area. The exposure amount on the wafer surface is, therefore, stabilized.

The sixth embodiment has exemplified a system in which the optical path space has a positive pressure with respect to a surrounding atmosphere. The method of this embodiment can also be applied to a system in which the exhaust amount in the optical path space is larger than the supply amount because the inert gas concentration becomes different between spaces A and B in FIGS. 16 and 17 due to diffusion of gas and the flow of a surrounding atmosphere.

[Seventh Embodiment]

Figure 11:
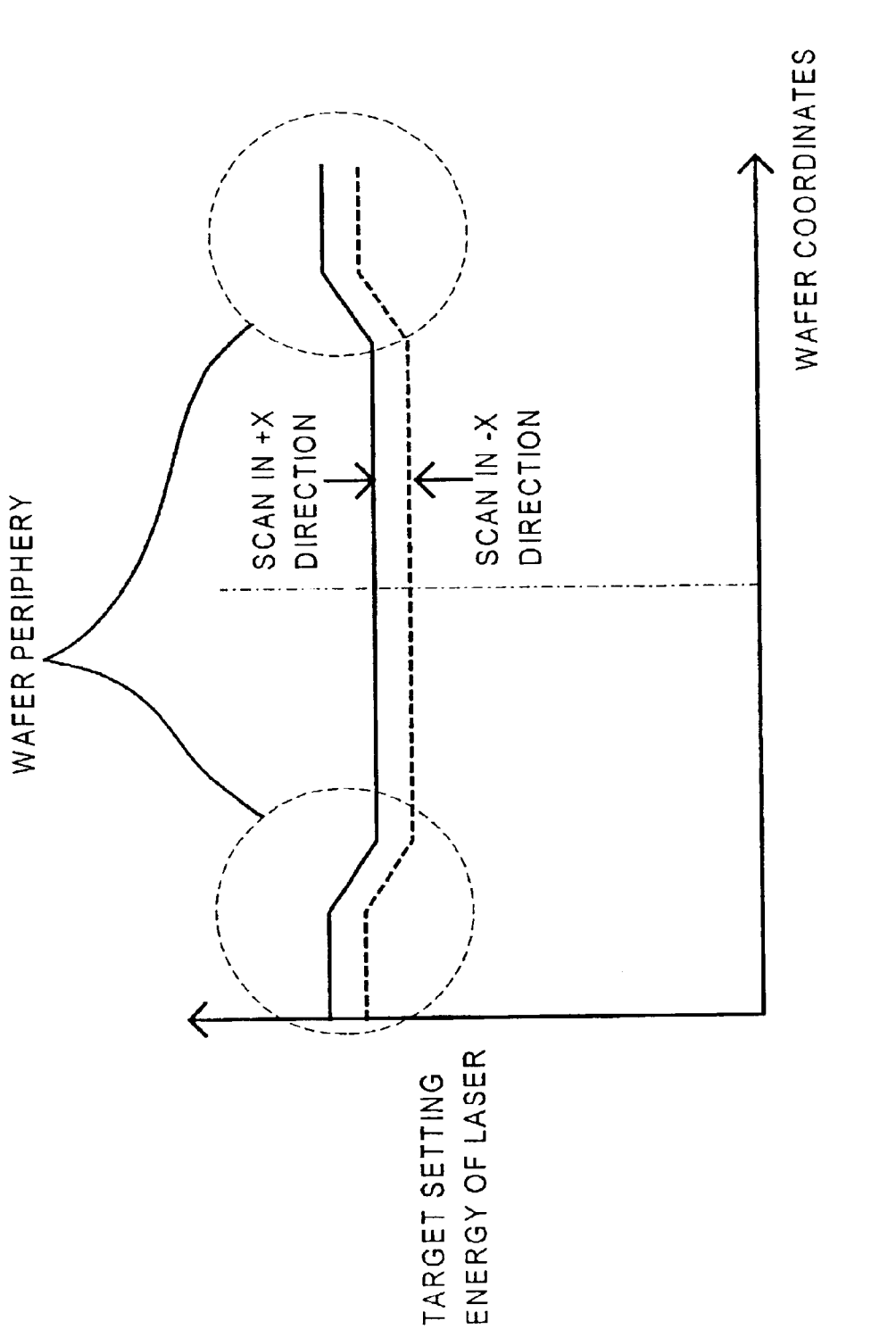
FIG. 11 is a graph showing the target setting energy of a laser serving as a light source at wafer coordinates according to the seventh embodiment of the present invention.

The sixth embodiment controls the target setting energy of the laser in accordance with the stage moving direction. Considering easy wafer exchange, the level of the wafer surface is slightly higher than the level of the wafer periphery. If the wafer periphery exists below the optical path space, the surrounding ambience readily enters the optical path space to decrease the internal nitrogen gas concentration. To prevent this, the target energy is set high in exposing the wafer periphery, as shown in FIG. 11, unlike the first embodiment. The exposure amount on the wafer surface can be stabilized even in the presence of a step at the wafer periphery.

Similar to the above-described embodiments, the same effects can also be obtained by controlling the emission interval of the laser, using an optical filter, or controlling the stage moving speed, in place of changing the target setting energy of the laser.

Although a step exists at the wafer periphery, a step at the reticle periphery can be easily eliminated because the reticle moves only along the X-axis during scanning exposure. Thus, only entrainment along with movement is considered on the reticle stage side.

[Eighth Embodiment]

Figure 12:
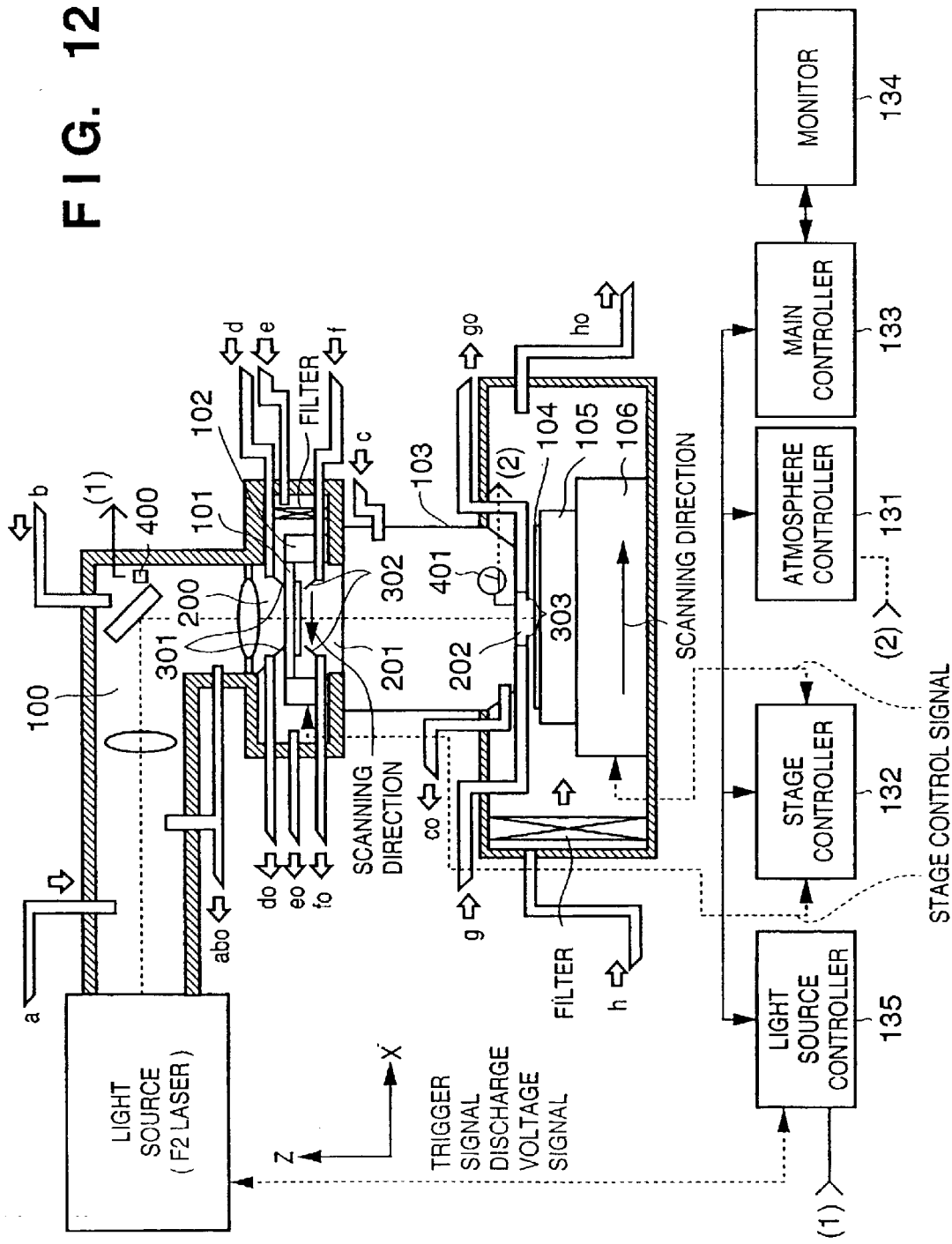
FIG. 12 is a view showing an exposure apparatus according to the eighth embodiment of the present invention.
Figure 15:
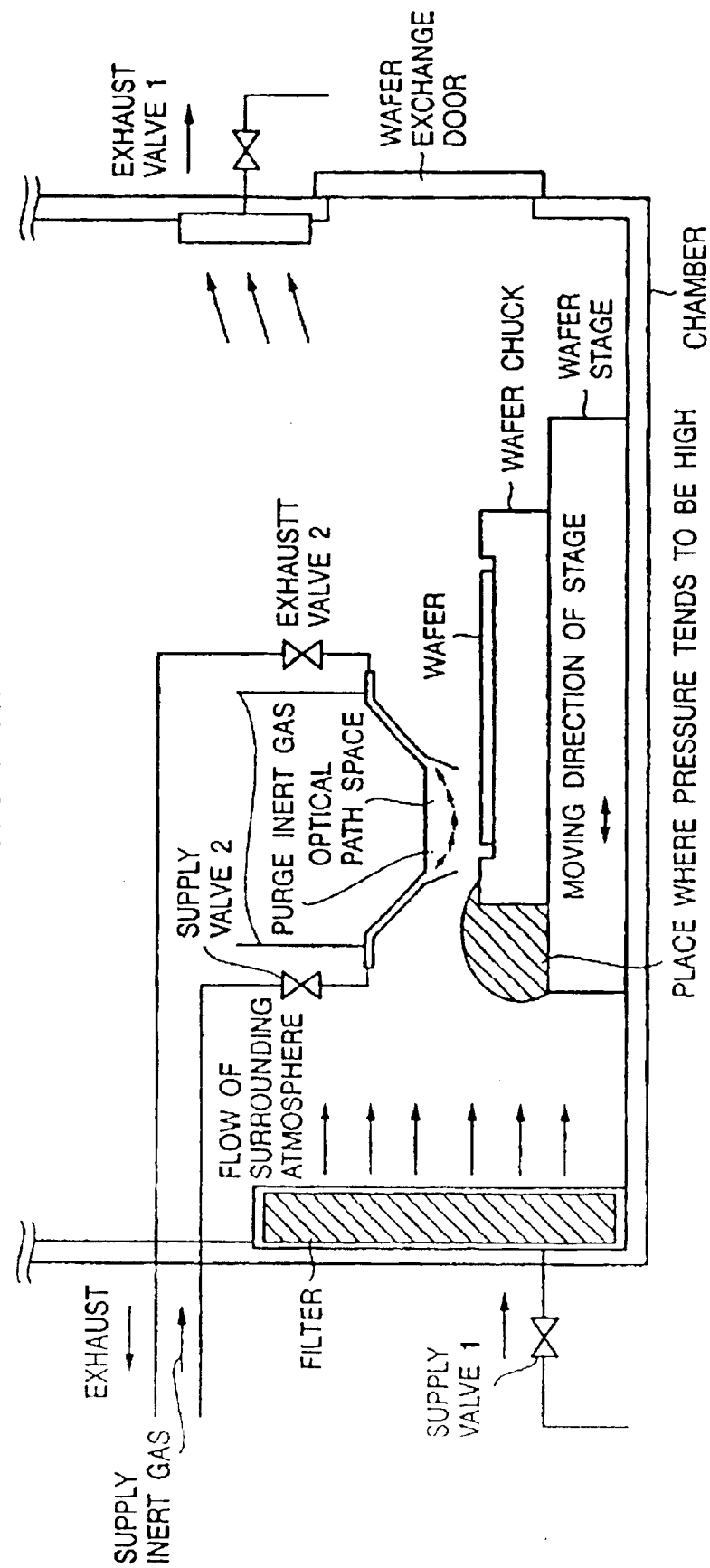
FIG. 15 is a view for explaining a prior art arrangement.

FIG. 12 is a view showing the eighth embodiment of the present invention. The embodiment in FIG. 12 is different from the embodiment in FIG. 8 in that a pressure sensor 401 is so arranged as to monitor the pressure in an optical path space 202. As described with reference to FIG. 15, a temperature control gas is supplied around the exposure region in order to stabilize the temperature of an atmosphere around the stage. The pressure increases slightly at that end of the wafer stage to which the temperature control gas is blown directly. As the wafer stage moves, the pressure distribution around the optical path space changes, and thus the pressure in the optical path space changes. This pressure change is monitored to perform laser control and stage control on the basis of the pressure value.

Figure 13:
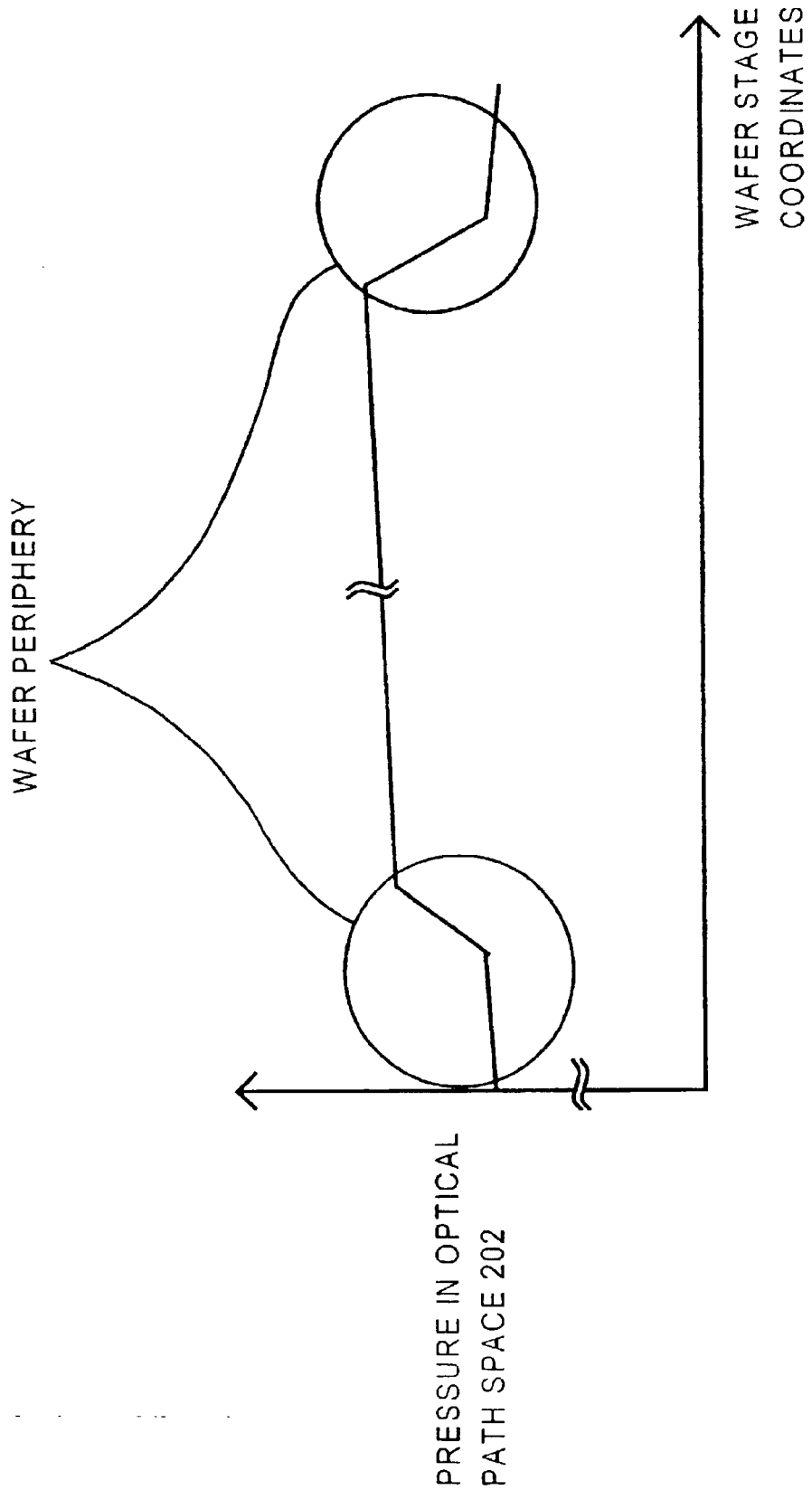
FIG. 13 is a graph showing a change in pressure in the optical path space according to the eighth embodiment of the present invention.

FIG. 13 shows pressure changes in an optical path space 202. If a step exists at the wafer periphery, the internal pressure decreases, similar to the second embodiment. The internal pressure becomes lower than a pressure in a case wherein the wafer surface exists so as to close the optical path space from below it. The internal pressure increases as that end of the wafer stage to which the temperature control gas is blown directly comes close to below the optical path space. The pressure change amount and pressure value are correlative to the stage moving speed (moving direction) and coordinates. For this reason, the exposure amount on the wafer surface can be stabilized by monitoring the pressure while controlling the laser and stage, similar to the above-described embodiments.

A positive pressure change amount means that a wafer stage 106 moves in the +X direction. The atmosphere in the space A shown in FIG. 16 is entrained in a large amount, and the nitrogen gas concentration in the optical path space 202 decreases. To prevent this, the target setting energy of the laser is set high, similar to the first embodiment. To the contrary, a negative pressure change amount means that the wafer stage 106 moves in the −X direction. The atmosphere in the space B shown in FIG. 16 is entrained in a large amount, and the nitrogen gas concentration in the optical path space 202 increases. In this case, the target setting energy of the laser is set low.

The exposure amount on the wafer surface can be stabilized by controlling the emission interval of the laser, using an optical filter, or controlling the stage moving speed, similar to the above-described embodiments.

The eighth embodiment has exemplified a method of stabilizing the exposure amount on the wafer surface on the basis of the pressure in the optical path space. The pressure around the optical space similarly changes, and thus may be controlled by arranging a pressure sensor around the optical path space. Also, in this case, the same effects can be obtained.

[Ninth Embodiment]

Figure 14:
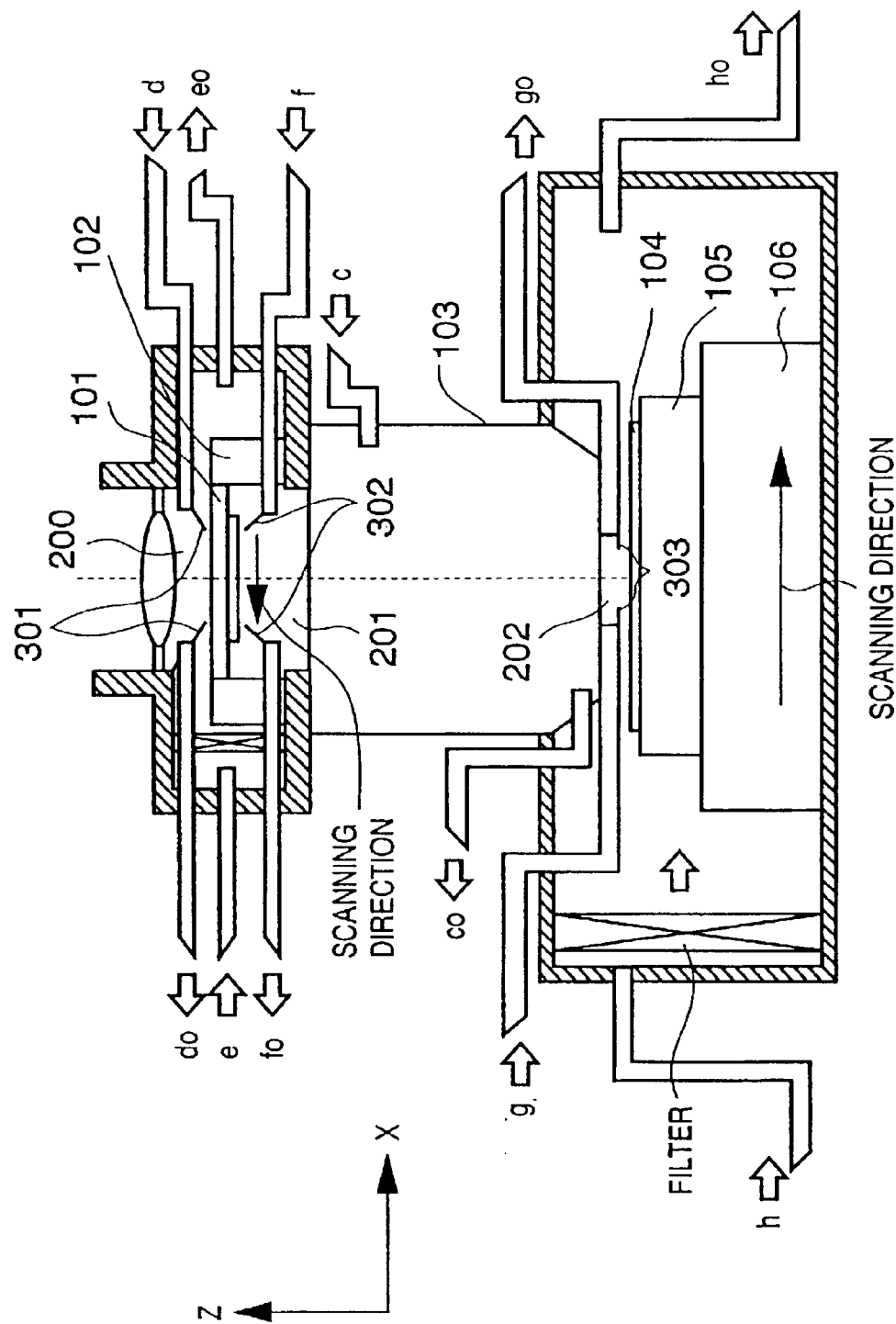
FIG. 14 is a view showing an exposure apparatus according to the ninth embodiment of the present invention.

FIG. 14 is a view showing the ninth embodiment of the present invention. The ninth embodiment is different from the eighth embodiment in that the temperature control gas flows in the −X direction on the reticle stage side.

In FIG. 14, during scanning exposure, the wafer stage moves along the +X-axis, whereas the reticle stage moves along the −X-axis. A surrounding temperature control gas flows along the +X-axis on the wafer stage side and the +X-axis on the reticle stage side.

In this arrangement, the nitrogen gas concentrations in optical spaces 200, 201, and 202 change as follows except for exposure of the wafer periphery. That is, the nitrogen gas concentrations in the optical path spaces 201 and 202 increase when the concentration in the optical path space 200 decreases, and decrease when the concentration in the optical path space 200 increases. This can relax the concentration change amount.

The first to ninth embodiments described above may be properly combined. More specifically, the present invention may use only one or a plurality of means selected from a means for supplying an inert gas to an optical path space, a means for exhausting the inert gas from the optical path space, a means for supplying the inert gas to an atmosphere surrounding the optical path space, a means for adjusting an output from a laser serving as an exposure light source, a means for inserting a filter in the optical path of exposure light to adjust the light quantity of exposure light which reaches a wafer, a means for adjusting the stop in the optical path of exposure light to adjust the light quantity of exposure light which reaches a wafer, and their alternative means.

[Tenth Embodiment]

A semiconductor device manufacturing process utilizing the exposure apparatus described above by any one of the first to ninth embodiments will be described as a tenth embodiment.

Figure 6:
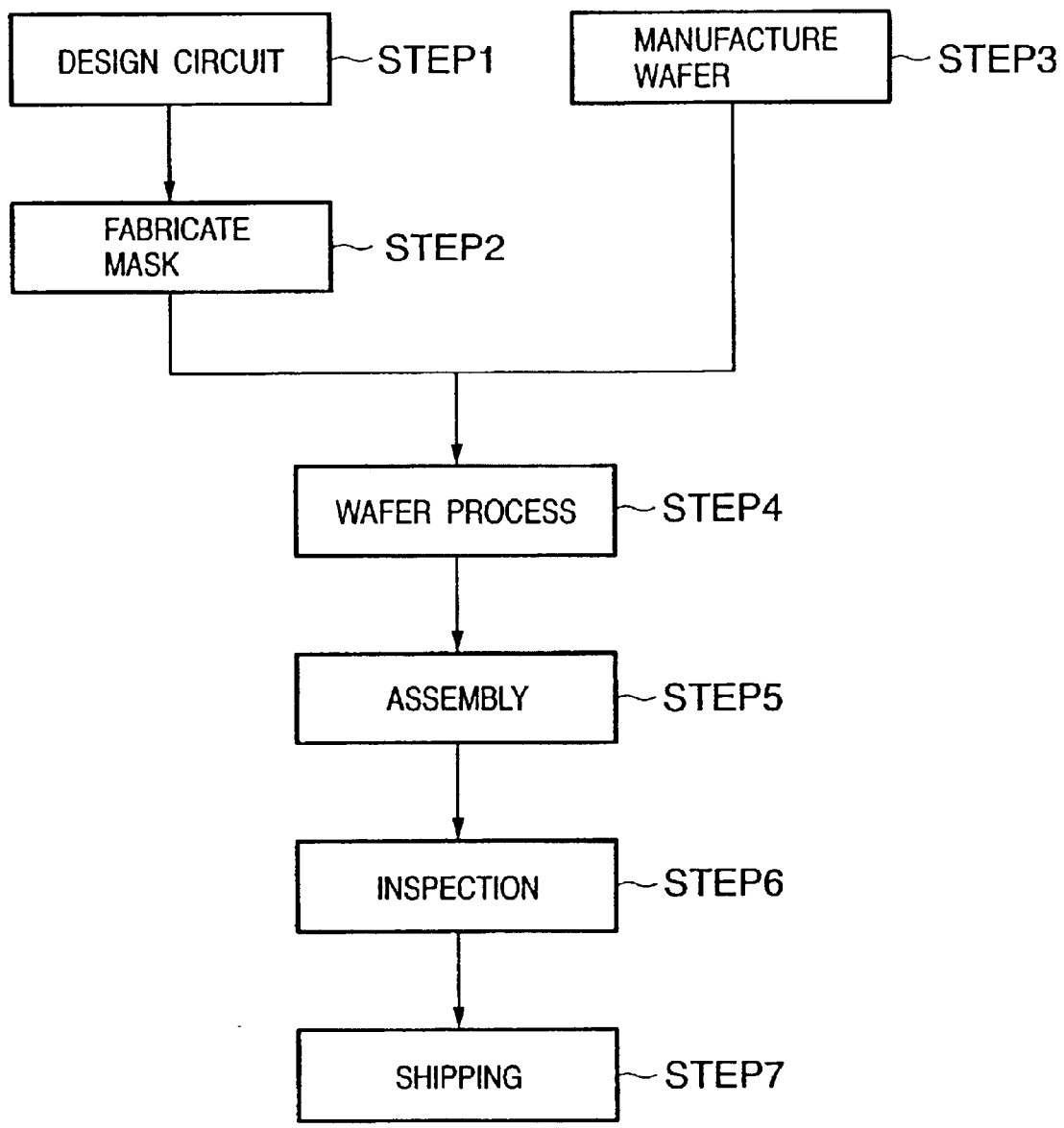
FIG. 6 is a flow chart of an entire manufacturing process for a semiconductor device, according to the tenth embodiment of the present invention.

FIG. 6 shows the flow of an overall semiconductor device manufacturing process.

In step 1 (design circuit), a semiconductor device circuit is designed. In step 2 (fabricate mask), a mask is fabricated on the basis of the designed circuit pattern. In step 3 (manufacture wafer), a wafer is manufactured by using a material such as silicon. In step 4 (wafer process), called a pre-process, an actual circuit is formed on the wafer by lithography using the above mask and wafer and the above exposure apparatus described by any one of the first to ninth embodiments.

In step 5 (assembly), called a post-process, a semiconductor chip is formed by using the wafer fabricated in step 4, and includes processes such as an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed, and shipped in step 7.

Figure 7:
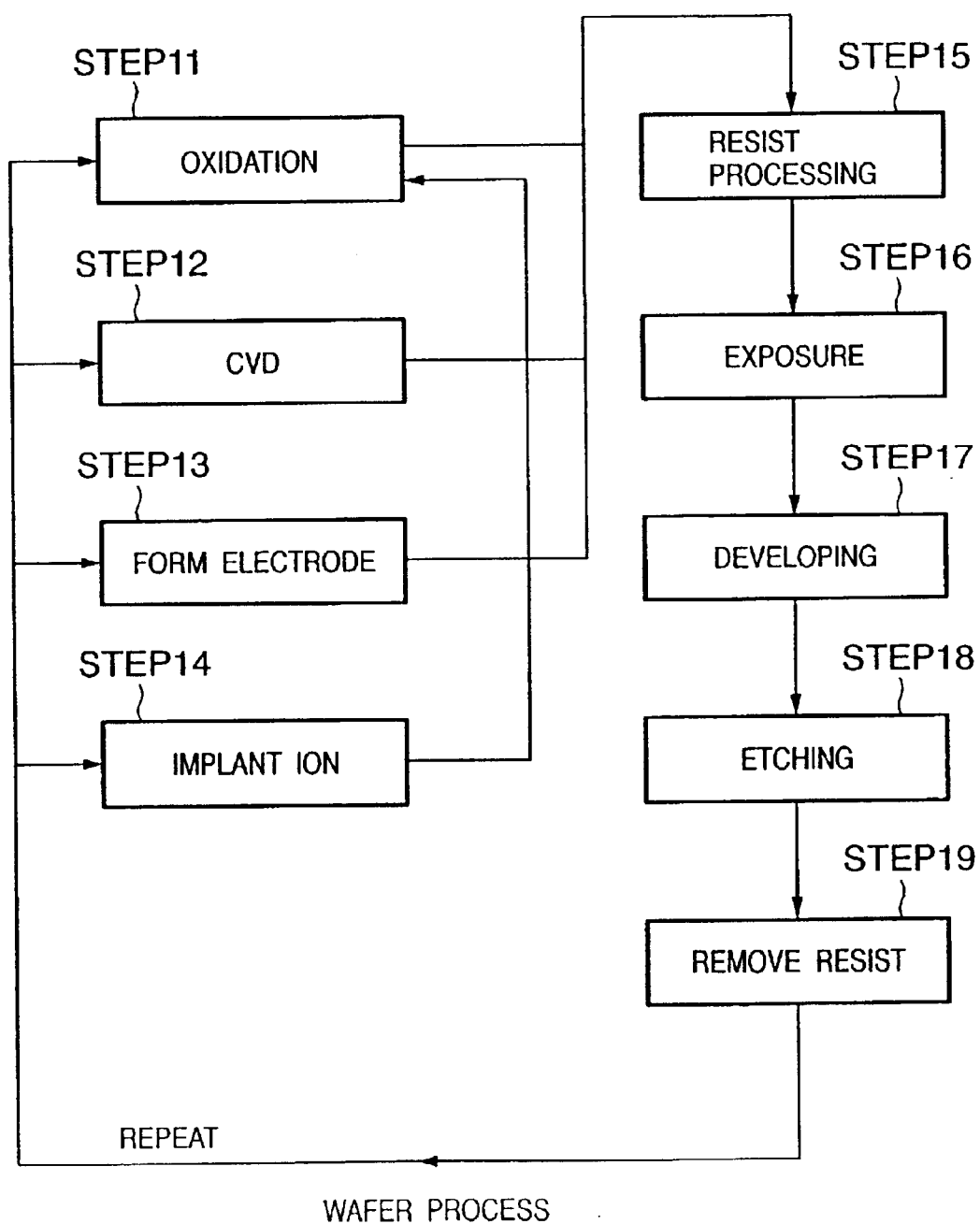
FIG. 7 is a flow chart of an entire manufacturing process for a semiconductor device, according to the tenth embodiment of the present invention.

FIG. 7 shows the detailed flow of the above wafer process.

In step 11 (oxidation), the surface of the wafer is oxidized. In step 12 (CVD), an insulating film is formed on the wafer surface. In step 13 (form electrode), an electrode is formed on the wafer by vapor deposition. In step 14 (implant ion), ions are implanted in the wafer. In step 15 (resist processing), a photosensitive agent is applied to the wafer. In step 16 (exposure), the above-mentioned exposure apparatus transfers the circuit pattern to the wafer. In step 17 (developing), the exposed wafer is developed. In step 18 (etching), the resist is etched except for the developed resist image. In step 19 (remove resist), an unnecessary resist after etching is removed. These steps are repeated to form multiple circuit patterns on the wafer.

The above-described embodiments can provide an exposure apparatus capable of stabilizing the exposure amount at high precision in correspondence with changes in inert gas concentration in an optical path space including a space through which exposure light passes (exposure region), such as a space between a projection optical system and substrate, a space between an illumination optical system for illuminating a mask (e.g., a reticle) and a mask stage for holding the mask, and a space between the mask stage and the projection optical system, a control method for the same, and a device manufacturing method.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus comprising:
   an illumination optical system which illuminates a pattern formed on a mask with light from a light source;
   a movable mask stage for holding the mask;
   a projection optical system which guides light from a pattern of the mask to a wafer;
   a movable wafer stage for holding the wafer;
   a shielding member which forms an optical path space including an optical path of exposure light and a space surrounding the optical path space at, of a space through which the exposure light passes, at least one portion between said illumination optical system and said mask stage, between said mask stage and said projection optical system, or between said projection optical system and said wafer stage;

first gas supply means for supplying an inert gas to the optical path space;

a chamber surrounding said wafer stage, said projection optical system and said shielding member; and reduction means for reducing a change in total light quantity of the exposure light reaching the wafer that is caused by movement of at least one of said mask stage and said wafer stage.

2. The apparatus according to claim 1, wherein said reduction means includes means for adjusting a light quantity which reaches the pattern of the mask.

3. The apparatus according to claim 1, wherein said reduction means includes means for adjusting a light quantity of the light source.

4. The apparatus according to claim 1, wherein said reduction means includes means for inserting a filter into the optical path of the exposure light from the light source.

5. The apparatus according to claim 1, wherein said reduction means includes means for adjusting a stop arranged in the optical path of the exposure light from the light source.

6. The apparatus according to claim 1, wherein said reduction means includes means for adjusting a driving speed of at least one of said mask stage and said wafer stage.

7. The apparatus according to claim 1, wherein said reduction means is controlled based on at least one of (i) positional information of at least one of said mask stage and said wafer stage, (ii) information about a moving speed, and (iii) information about a moving direction.

8. The apparatus according to claim 1, wherein said apparatus further comprises a pressure sensor which measures a pressure in the optical path space, and said reduction means is controlled in accordance with an output from said sensor.

9. The apparatus according to claim 1, wherein said apparatus further comprises a concentration sensor which measures at least one of an oxygen concentration and a water concentration in the optical path space, and said reduction means is controlled in accordance with an output from said sensor.

10. The apparatus according to claim 1, further comprising second gas supply means for supplying a gas to the surrounding space.

11. The apparatus according to claim 10, wherein said gas supplied by said second gas supply means is an inert gas.

12. The apparatus according to claim 1, wherein said shielding member shields from the surrounding space a first optical path space between said wafer stage and said projection optical system, and said first gas supply means supplies the inert gas toward a predetermined direction.

13. The apparatus according to claim 1, wherein said shielding member shields from the surrounding space a first optical path space between said wafer stage and said projection optical system, said shielding member shielding from the surrounding space a second optical path space at least one of between said illumination optical system and said mask stage and between said mask stage and said projection optical system, and a supply port which supplies the inert gas to the first optical path space by said first gas supply means, and a supply port which supplies the inert gas to the second optical path space by said first gas supply means are formed at substantially opposite positions with respect to an optical axis of at least one of said illumination optical system and said projection optical system.

14. The apparatus according to claim 1, wherein said reduction means adjusts an amount of at least one of the inert gas supplied to the optical path space and the gas exhausted from the optical space.

15. The apparatus according to claim 10, wherein said reduction means adjusts an amount of the gas supplied to the surrounding space by said second gas supply means.

16. The apparatus according to claim 1, wherein said reduction means adjusts a light quantity of the transmittance of the exposure light caused by movement of at least one of said mask stage and said wafer stage.

17. The apparatus according to claim 1, wherein said apparatus includes a scanning exposure apparatus, and said reduction means changes a scanning speed with respect to a change in transmittance of the exposure light caused by movement of at least one of said mask stage and said wafer stage.

18. The apparatus according to claim 1, wherein said reduction means reduces a change in inert gas concentration in the optical path space.

19. The apparatus according to claim 10, wherein said reduction means reduces a change in a pressure difference between the optical path space and the surrounding space by said second gas supply means.

20. A device manufacturing method comprising the steps of:

transferring, by using the exposure apparatus defined in claim 1, a pattern onto a substrate applied with a photosensitive material; and developing the substrate.

21. An exposure apparatus comprising:

an illumination optical system which illuminates a pattern formed on a mask with light from a light source;

a projection optical system which guides a light from a pattern of the mask to a wafer;

a movable wafer stage for holding the wafer;

a chamber surrounding said wafer stage and said projection optical system;

a shielding member for shielding an optical path space between said projection optical system and said wafer stage, surrounding an optical path of exposure light from said light source, from a space surrounding the optical path space;

first gas supply means for supplying an inert gas to the optical path space; and reduction means for reducing a change in total light quantity of the exposure light reaching the wafer.

22. The apparatus according to claim 21, wherein said reduction means includes means for adjusting a stop arranged in the optical path of the exposure light from the light source.

23. The apparatus according to claim 21, wherein said reduction means includes means for adjusting a driving speed of said wafer stage.

24. The apparatus according to claim 21, wherein the change in total light quantity of the exposure light reaching the wafer is caused by movement of said wafer stage.

25. A device manufacturing method comprising the steps of:

exposing a wafer by using the exposure apparatus defined in claim 21; and developing the wafer.

* * * * *

UNITED STATES PATENT AND TRADEMARK OFFICE
CERTIFICATE OF CORRECTION

PATENT NO. : 6,721,032 B2
DATED : April 13, 2004
INVENTOR(S) : Noriyasu Hasegawa et al.

It is certified that error appears in the above-identified patent and that said Letters Patent is hereby corrected as shown below:

Title page,
Item [56], References Cited, FOREIGN PATENT DOCUMENTS,
"JP     2001-168027    6/2000" should read -- JP      2001-168027    6/2001 --.

Column 3,
Line 12, "space." should read -- space; and --.

Signed and Sealed this

Thirtieth Day of November, 2004

JON W. DUDAS
*Director of the United States Patent and Trademark Office*